United States Patent
Uhm et al.

(10) Patent No.: US 9,406,644 B2
(45) Date of Patent: Aug. 2, 2016

(54) CHIP SEPARATION PROCESS FOR PHOTOCHEMICAL COMPONENT PRINTING

(71) Applicant: TEREPAC, Waterloo (CA)

(72) Inventors: Yun Uhm, Toronto (CA); Jayna Sheats, Palo Alto, CA (US)

(73) Assignee: TEREPAC, Waterloo, CA (US)

( * ) Notice: Subject to any disclaimer, the term of this patent is extended or adjusted under 35 U.S.C. 154(b) by 0 days.

(21) Appl. No.: 14/558,708

(22) Filed: Dec. 2, 2014

(65) Prior Publication Data

US 2015/0155261 A1    Jun. 4, 2015

Related U.S. Application Data

(60) Provisional application No. 61/910,433, filed on Dec. 2, 2013.

(51) Int. Cl.
*H01L 23/00*    (2006.01)

(52) U.S. Cl.
CPC ....... *H01L 24/83* (2013.01); *H01L 2924/12033* (2013.01); *H01L 2924/12042* (2013.01)

(58) Field of Classification Search
CPC ......... H01L 24/80; H01L 24/83; H01L 27/00; H01L 27/144; H01L 51/0002; H01L 51/0012; H01L 51/0013
See application file for complete search history.

*Primary Examiner* — Armando Rodriguez

(57) ABSTRACT

Parallel transfers of components from donor plates to chip modules can be performed with a single alignment step, after arranging the components to have the correct lateral positions. For example, a dimension of the chip module can be separated to be an integer multiple of a period of the component array on the donor plates.

20 Claims, 29 Drawing Sheets

Providing a donor plate, wherein the donor plate comprises chips disposed on a photoactivated thermal transfer layer, wherein the chips are disposed on a chip array
500

Transferring at least one chip from each of the chip array to a substrate
510

*FIG. 5A*

Determining a period of a module array on a substrate
530

Verifying that the period matches a periodicity of a chip array on a donor plate, wherein the chip array is disposed on a photoactivated thermal transfer layer on the donor plate
540

Transferring at least one chip from each of the chip array to each module of the module array
550

*FIG. 5B*

Determining a first period of a module array on a substrate
600

Transferring chips on a first chip array on a first donor plate to a second chip array on a second donor plate, wherein a second period of the second chip array matches the first period, wherein the first and second chip arrays are disposed on a photoactivated thermal transfer layer on the first and second donor plates
610

Transferring at least one chip from each of the second chip array to each module of the module array
620

Repeating transferring for chips on a third donor plate to a fourth donor plate
630

Repeating transferring for chips on the fourth donor plate to the module array
640

*FIG. 6*

Providing a first donor plate, wherein the first donor plate comprises first chips disposed on a photoactivated thermal transfer layer, wherein the first chips are disposed on a first chip array having a first period
800

↓

Determining a second period of a module array on a substrate
810

↓

Transferring the first chips on the first donor plate to a second donor plate, wherein the first chips are disposed on a photoactivated thermal transfer layer on the second donor plate, wherein the first chips are disposed on a second chip array on the second donor plate having the second period
820

*FIG. 8*

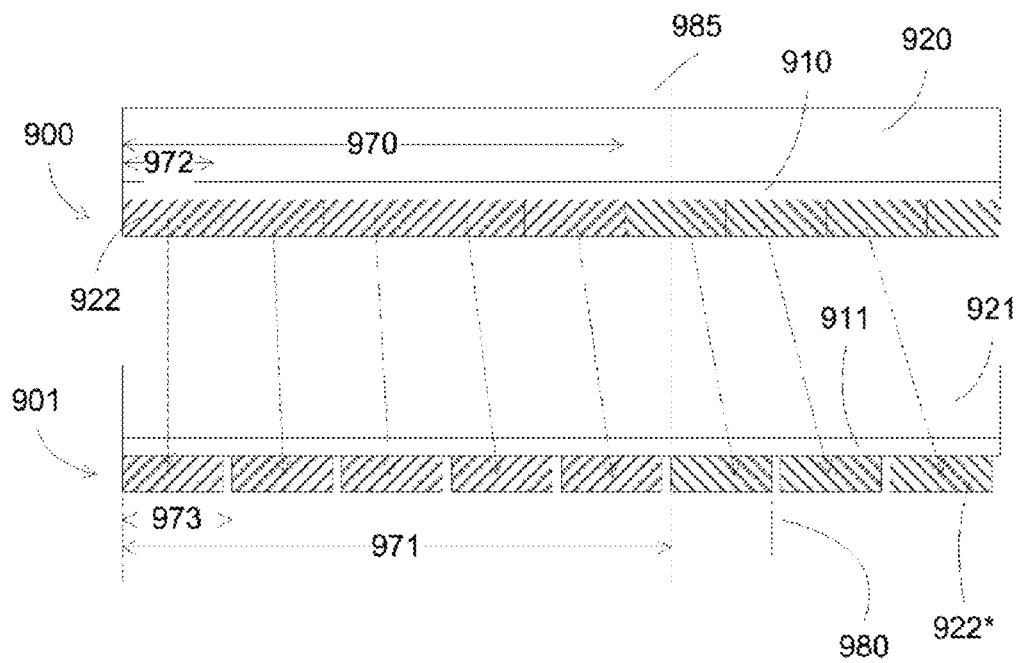
FIG. 9A
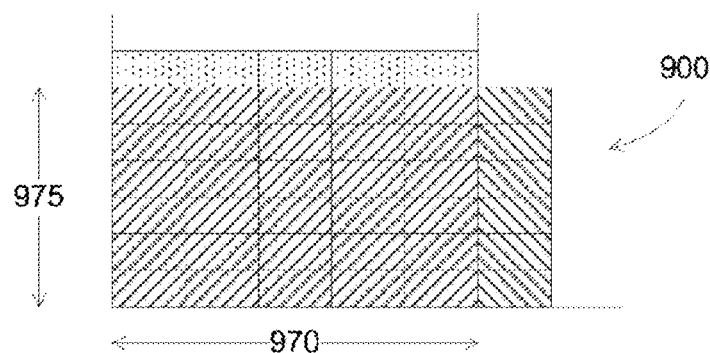
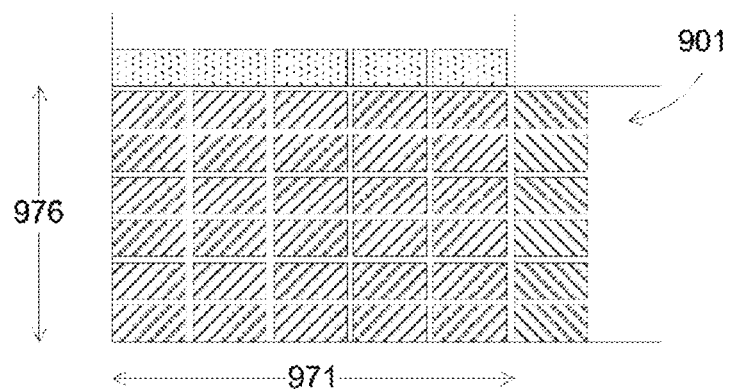
FIG. 9B

Transferring while spreading chips uniformly from a first donor plate to a second donor plate, wherein the chips are disposed on a photoactivated thermal transfer layer on the first and second donor plates, wherein the chips are spread to achieve a period of a module array on a substrate
1000

*FIG. 10A*

Providing a first donor plate, wherein the first donor plate comprises chips disposed on a photoactivated thermal transfer layer, wherein the chips are disposed on a first chip array having a first x period and a first y period
1020

Determining a second x period and a second y period of a module array on a substrate
1030

Transferring rows of the chips from the first donor plate to a second donor plate, wherein the rows are disposed on a photoactivated thermal transfer layer on the second donor plate, wherein the rows are disposed on a second chip array on the second donor plate having the second x period
1040

Transferring columns of the chips from the first donor plate to a second donor plate, wherein the columns are disposed on a photoactivated thermal transfer layer on the second donor plate, wherein the columns are disposed on the second chip array on the second donor plate having the second y period
1050

*FIG. 10B*

Transferring chips in cells of a chip array as a group from a first donor plate to a second donor plate while extending a period of the chip array, wherein the chips are disposed on a photoactivated thermal transfer layer on the first and second donor plates, wherein the period is extended to achieve a period of a module array on a substrate
1200

*FIG. 12A*

Providing a first donor plate, wherein the first donor plate comprises chips disposed on a photoactivated thermal transfer layer, wherein the chips are disposed on a first chip array having a first period
1220

Determining a second period of a module array on a substrate
1230

Transferring chips in cells of the chip array from the first donor plate to a second donor plate, wherein the chips are disposed on a photoactivated thermal transfer layer on the second donor plate, wherein the cells are disposed on a second chip array on the second donor plate having the second period
1240

*FIG. 12B*

Transferring a row of chips from a first donor plate to a second donor plate, wherein the first donor plate comprises chips disposed on a photoactivated thermal transfer layer, wherein the row of chips are disposed on a photoactivated thermal transfer layer on the second donor plate
1700

Moving the second donor plate with respect to the first donor plate, wherein the movement is configured to achieve a first separation that matches a first period of a module array on a substrate
1710

Repeating transferring and moving for all rows of chips in the first donor plate
1720

Transferring a column of chips from the first donor plate to the second donor plate
1730

Moving the second donor plate with respect to the first donor plate, wherein the movement is configured to achieve a second separation that matches a second period of a module array on a substrate
1740

Repeating transferring and moving for all columns of chips in the first donor plate
1750

*FIG. 17*

Determining first x and y periods of a module array on a substrate
2200

Transferring chips on a first chip array on a first donor plate to a second chip array on a second donor plate, wherein second x and y periods of the second chip array matches the x and y periods, wherein the first and second chip arrays are disposed on a photoactivated thermal transfer layer on the first and second donor plates
2210

Transferring at least one chip from each of the second chip array to each module of the module array
2220

Optionally moving the substrate relative to the second donor plate
2230

Optionally transferring at least one chip from each of the second chip array to each module of the module array
2240

Optionally transferring chips from a third donor plate
2250

*FIG. 22*

Transferring multiple arrays of chips from a first donor plate to multiple separate second donor plates, wherein the multiple arrays of chips are disposed on a photoactivated thermal transfer layer on the first donor plates, wherein the multiple arrays of chips are configured to be disposed on a photoactivated thermal transfer layer on the second donor plates
2500

Separating the multiple second donor plates
2510

*FIG. 25A*

Transferring first multiple arrays of chips from a first donor plate to first multiple separate second donor plates, wherein the first multiple separate second donor plates are arranged in a first configuration of a checker board configurations, wherein the first multiple arrays of chips are disposed on a photoactivated thermal transfer layer on the first donor plates, wherein the first multiple arrays of chips are configured to be disposed on a photoactivated thermal transfer layer on the second donor plates
2530

Transferring second multiple arrays of chips from the first donor plate to second multiple separate second donor plates, wherein the second multiple separate second donor plates are arranged in a second configuration of a checker board configurations, wherein the second multiple arrays of chips are disposed on a photoactivated thermal transfer layer on the first donor plates, wherein the second multiple arrays of chips are configured to be disposed on a photoactivated thermal transfer layer on the second donor plates
2540

*FIG. 25B*

CHIP SEPARATION PROCESS FOR PHOTOCHEMICAL COMPONENT PRINTING

The present application claims priority from U.S. provisional patent application Ser. No. 61/910,433, filed on Dec. 2, 2013, entitled "Chip separation process for photochemical component printing", which is incorporated herein by reference.

BACKGROUND

This invention pertains to devices which are fabricated using photoactivated thermal transfer elements as described in U.S. Pat. No. 6,946,178 and U.S. Pat. No. 7,141,348 by Sheats et al., which are hereby incorporated by reference. These patents disclose a method of transferring, or printing, thin film devices from a donor substrate (also here called a donor plate), on which the polymeric photoactivated thermal transfer material has been applied, onto a target substrate. In this process, irradiation with actinic light is used to selectively activate the polymer under a device which the user wishes to transfer, while leaving other devices on the same substrate unactivated. Heating the polymer (referred to herein as a Digital Release Adhesive, or DRA) causes it to vaporize and transfer the device to a target substrate in close proximity while leaving the unactivated devices on the donor substrate. By this method, such objects as very small integrated circuit chips, with lateral dimensions of less than 100 µm, for example, which are difficult or impossible to handle effectively by other means such as the pick and place machines which are well known in the art, can be placed onto product substrates at very high speed. The described process is advantageously used for small and thin silicon chips, but may also be used with any object which is thin enough to be readily adhered to a thin polymer film; for example light emitting diodes, thin film sensors, MEMS devices, thin film capacitors or resistors, any semiconductor device or component, and other electronic or optical components, some of which are described in the referenced patents by Sheats et al.

FIG. 1 illustrates a prior art transferring process according to some embodiments. Multiple chips 130 can be adhered to a donor plate 110 through a layer 120 of a polymeric photoactivated thermal transfer material. By radiating, e.g., using a visible light or a laser beam 140, together with an optional heating process, the portion 122 of the polymeric photoactivated thermal transfer material can be evaporated, releasing chip 132 onto a substrate 150.

There is a need for printing multiple components on a chip module with high throughput using polymeric photoactivated thermal transfer material.

SUMMARY OF THE DESCRIPTION

In some embodiments, the present invention discloses methods and systems for arranging components of a module in correct lateral positions on donor plates. The components thus can be parallel transferred, and multiple modules can be prepared simultaneously.

For example, a module can have a length L, with three components disposed thereon. The components can be prepared on donor plates with correct lateral positions, e.g., the length L can be an integer multiple of a period of the components.

To perform parallel transfer, multiple modules can be arranged on a substrate. Since the modules have a length L, the module can form an array with a period of L. A first donor plate having the first components can be positioned on the substrate, with a first component in the first donor plate aligned with a correct position on a module of the substrate. Since the first components have been arranged as an array on the first donor plate so that the length L is an integer multiple of the first component array, there is a first component in the first component array that is aligned with an adjacent module. Thus multiple first components on the first donor plate can be simultaneously transferred to the substrate, with each first component transferred to each module.

The process can be repeated with the second and third donor plates having the second and third components. Since the second and third components have been arranged as arrays on the second and third donor plates so that the length L is an integer multiple of the second and third component arrays, there is a second and third component in the second and third component arrays that is aligned with an adjacent module. Thus multiple second and third components on the second and third donor plates can be simultaneously transferred to the substrate, with each second and third components transferred to each module.

BRIEF DESCRIPTION OF THE DRAWINGS

FIGS. 5A-5B illustrate flow charts for a parallel transfer process according to some embodiments.

FIG. 6 illustrates a flow chart for a parallel transfer process according to some embodiments.

FIG. 8 illustrates a flow chart for chip separation according to some embodiments.

FIGS. 9A-9B illustrate a chip separation process according to some embodiments.

FIGS. 10A-10B illustrate flow charts for a chip separation process according to some embodiments.

FIGS. 12A-12B illustrate flow charts for a chip separation process according to some embodiments.

FIG. 17 illustrates a flow chart for chip separation according to some embodiments.

FIG. 22 illustrates a flow chart for parallel transfer according to some embodiments.

FIGS. 25A-25B illustrate flow charts for parallel transfer according to some embodiments.

DETAILED DESCRIPTION OF THE EMBODIMENTS

Figure 1:
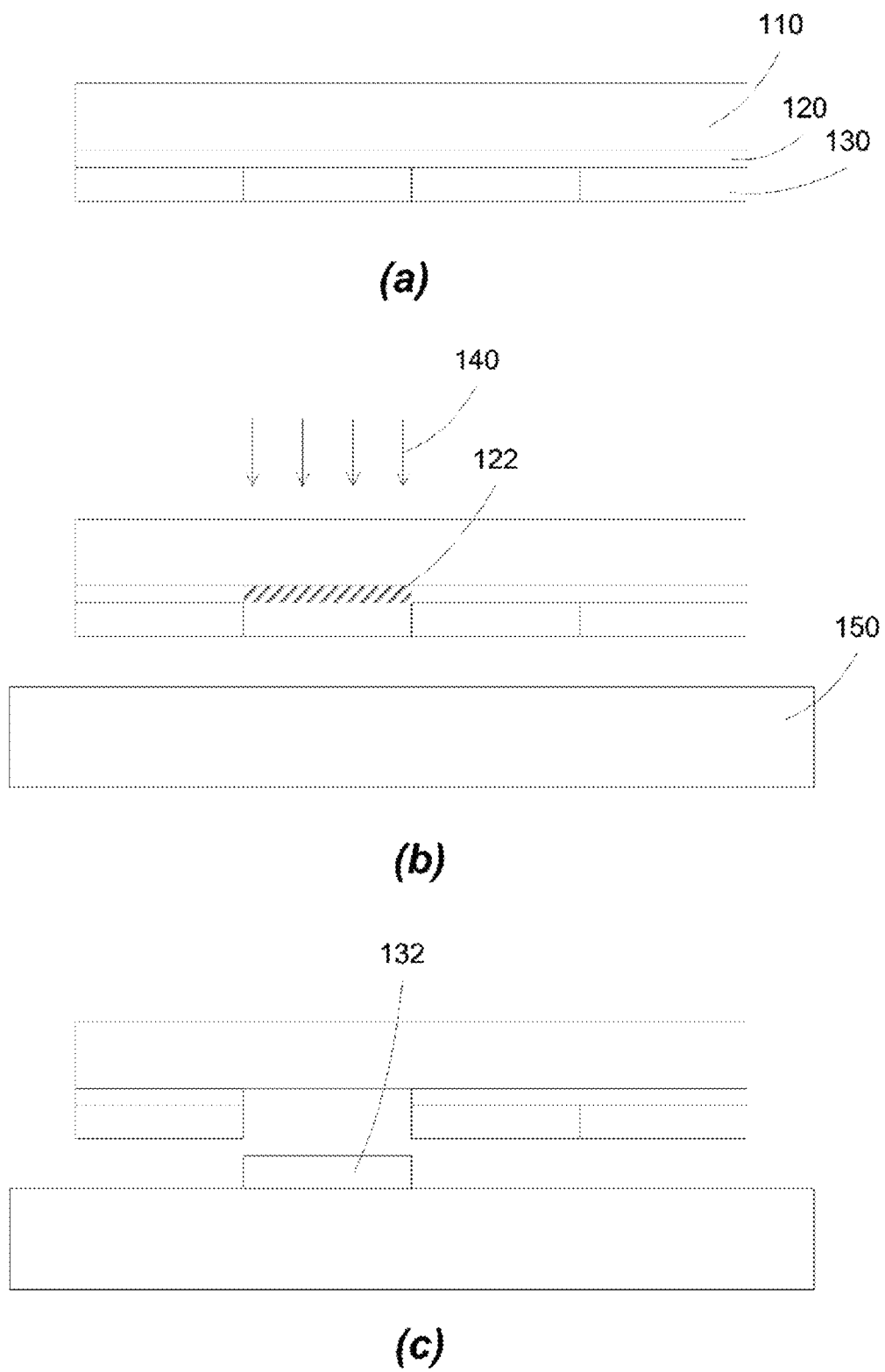
FIG. 1 illustrates a prior art transferring process according to some embodiments.
Figure 2A:
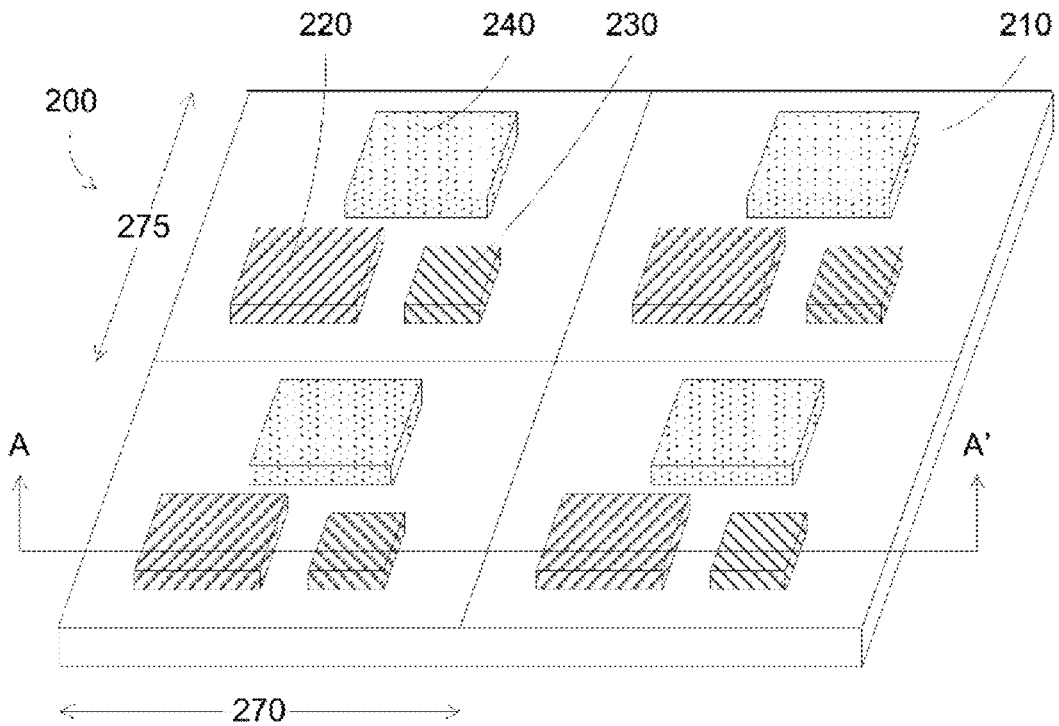
FIGS. 2A-2B illustrate a configuration for the chip modules according to some embodiments.
Figure 2B:
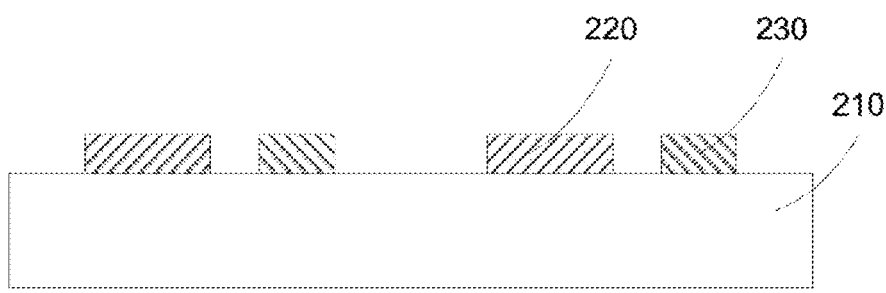

FIGS. 2A-2B illustrate a configurations for the chip modules according to some embodiments. FIG. 2A shows a perspective view and FIG. 2B shows a cross section AA' of a substrate 200 having 4 chip modules 210. The chip modules 210 can be arranged in an array, e.g., having the chip modules arranged next to each other to form a 2D array. A length 270 of a chip module 210 can be a x period of the array. A width 275 of a chip module 210 can be a y period of the array. Each chip module 210 can have three components 220, 230, and 240 disposed on the chip module.

Figure 3A:
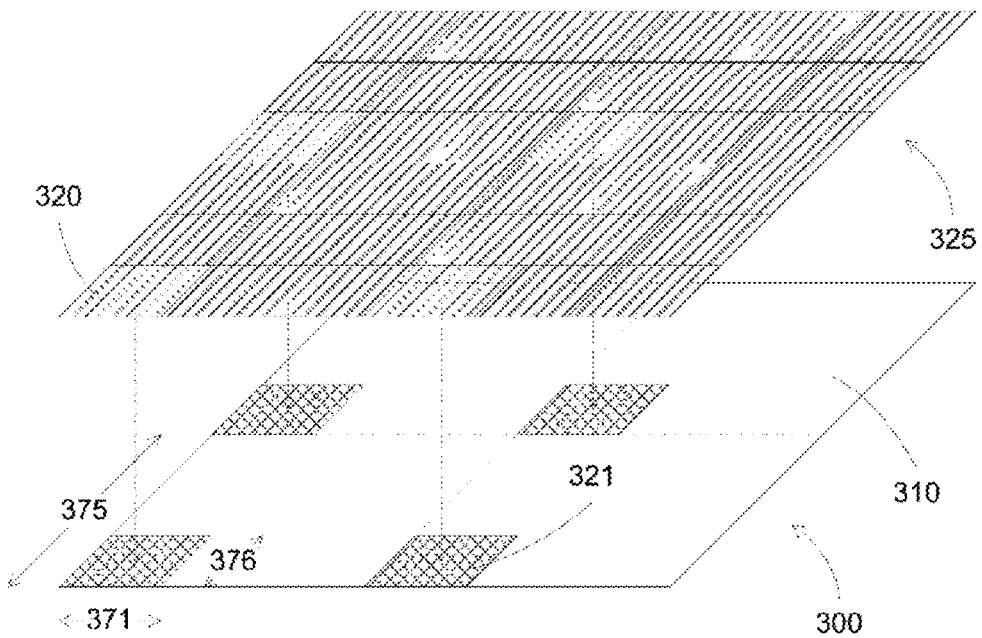
FIGS. 3A-3B illustrate a parallel transfer process according to some embodiments.
Figure 3B:
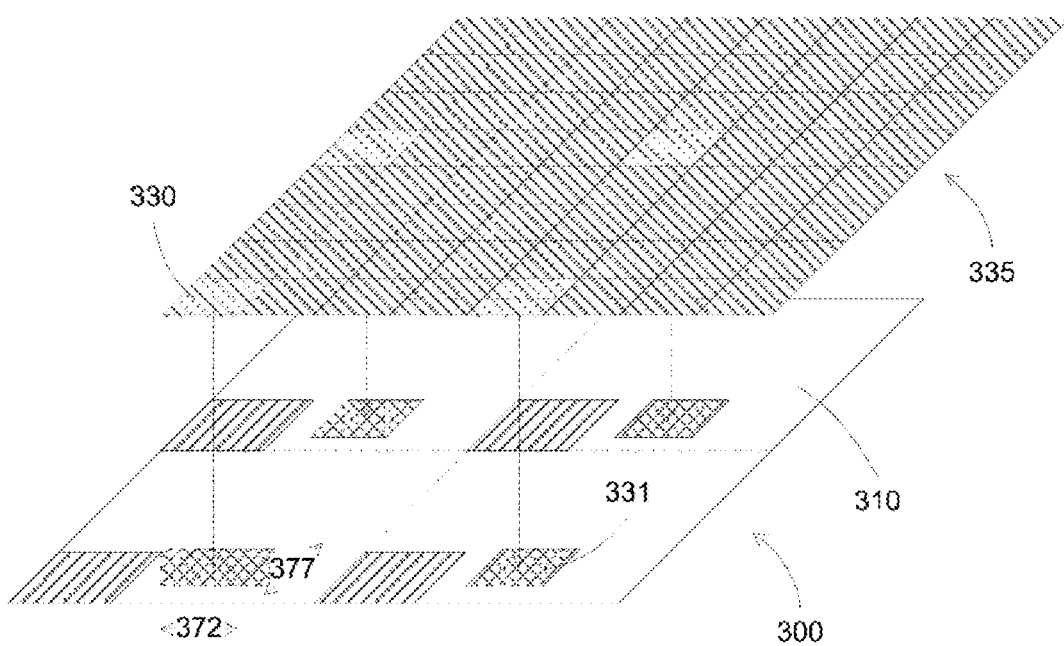

FIGS. 3A-3B illustrate a parallel transfer process according to some embodiments. A substrate 300 can have multiple chip modules 310 arranged in a 2D array, for example, a 2×2 array having 2 chip modules 310 on each side as shown in the figure.

In FIG. 3A, a first donor plate 325 can be placed above the substrate 300. The donor plate 325 can include an array of components (chips) above the substrate 300, transferring four targets 321 out of a larger array. A target can be the area which is reserved for components of one product module, such as a micromodule. A typical dimension of a target is around 1 to 2 cm on each side. The components 320, e.g. integrated circuit bare dice, are typically around 0.2 to 2 mm on each side. If they are transferred to the donor plate from the dicing tape (as received from supply vendor), the spatial period is equal to the chip dimension plus the dicing kerf width, which is typically about 20 microns. In order to transfer chips to all targets (as shown) simultaneously without moving the donor plate relative to the substrate, the chip array spatial period must be an integer multiple of the target array spatial period.

Multiple chips 320 can be simultaneously transferred from the donor plate 325 to the substrate 300. The chips 320 are arranged on the donor plate 325 in an array having correct lateral positions, e.g., the length 370 of the chip module 310 is an integer multiple of the length 371 of the chip 320 (in this case length 370=3× length 371) and the width 375 of the chip module 310 is an integer multiple of the width 376 of the chip 320 (in this case width 375=3× width 376). Thus, by aligning a chip 320 to the correct position, all 4 chips 320 can be simultaneously transferred to the correct positions on each of the chip modules 310 on the substrate 300.

The process can be repeated. For example, the substrate 300 can be moved to under a second donor plate 335. Multiple chips 330 can be simultaneously transferred from the donor plate 335 to the substrate 300 on the targets 331 of the modules 310. The chips 330 are arranged on the donor plate 335 in an array having correct lateral positions, e.g., the length 370 of the chip module 310 is an integer multiple of the length 372 of the chip 330 (in this case length 370=4× length 372) and the width 375 of the chip module 310 is an integer multiple of the width 377 of the chip 330 (in this case width 375=4× width 377). Thus, by aligning a chip 330 to the correct position, all 4 chips 330 can be simultaneously transferred to the correct positions on each of the chip modules 310 on the substrate 300.

Figure 4A:
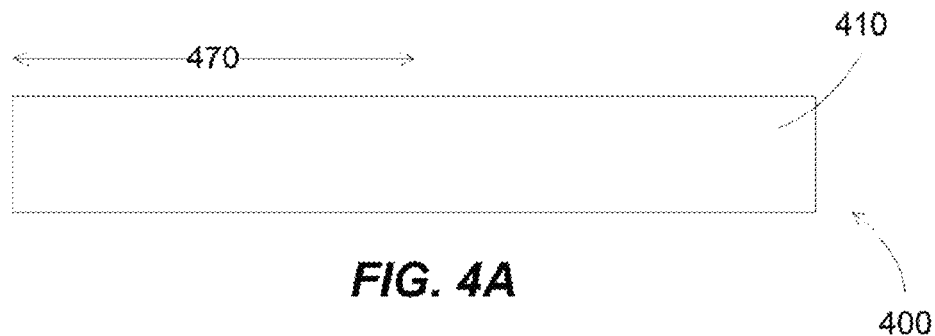
FIGS. 4A-4C illustrate a parallel transfer process according to some embodiments.
Figure 4B:
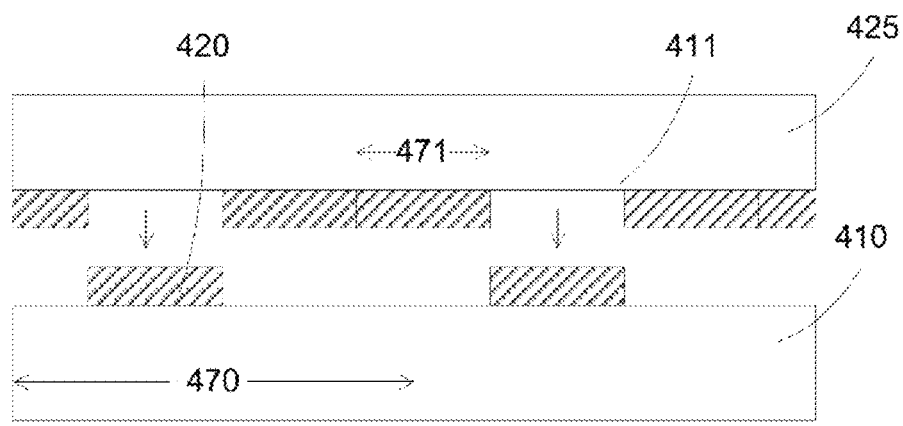
Figure 4C:
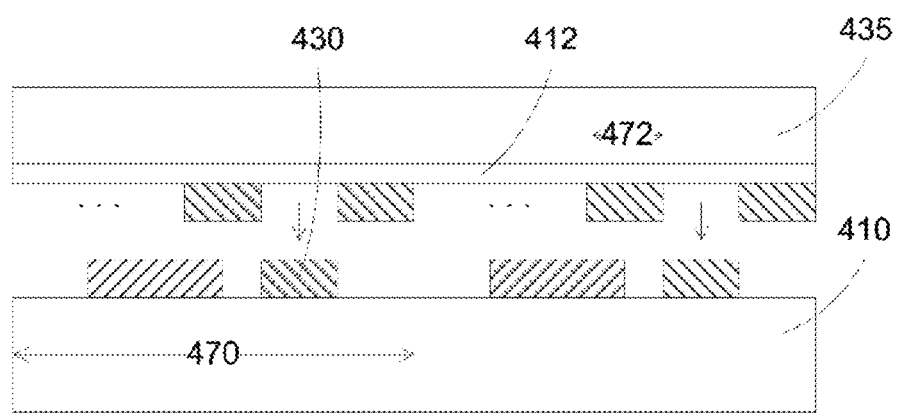

FIGS. 4A-4C illustrate a parallel transfer process according to some embodiments. In FIG. 4A, a substrate 400 can have multiple chip modules 410 arranged in an array, for example, an array having 2 chip modules 410 as shown in the figure.

In FIG. 4B, a first donor plate 425 can be placed above the substrate 400. The donor plate 425 can include multiple chips 420 disposed on a layer 411 of a photoactivated thermal transfer material. Multiple chips 420 can be simultaneously transferred from the donor plate 425 to the substrate 400. The chips 420 are arranged on the donor plate 425 in an array having correct lateral positions, e.g., the length 470 of the chip module 410 is an integer multiple of the length 471 of the chip 420. Thus, by aligning a chip 420 to the correct position, all 2 chips 420 can be simultaneously transferred to the correct positions on each of the chip modules 410 on the substrate 400.

The process can be repeated. For example, the substrate 400 can be moved to under a second donor plate 435. The donor plate 435 can include multiple chips 430 disposed on a layer 412 of a photoactivated thermal transfer material. Multiple chips 430 can be simultaneously transferred from the donor plate 435 to the substrate 400. The chips 430 are arranged on the donor plate 435 in an array having correct lateral positions, e.g., the length 470 of the chip module 410 is an integer multiple of the length 472 of the chip 430. Thus, by aligning a chip 430 to the correct position, all 2 chips 430 can be simultaneously transferred to the correct positions on each of the chip modules 410 on the substrate 400.

In some embodiments, the objects to be transferred can be integrated circuits or other electronic or optoelectronic components which have been derived from a flat wafer such as a silicon wafer, which is processed to form circuits in the manner known in the art. After the circuits are fully formed, the wafer, which may be around 0.5 to 0.75 mm thick during processing, is thinned by a combination of grinding and polishing known in the art; one company which provides equipment for this purpose is Disco Corporation, 13-11 Omori-Kita 2-chome, Ota-ku, Tokyo 143-8580 Japan. The wafers may be made any thickness from the original down to about 5 µm; typically between around 20 and 50 µm. The wafer is then attached to a dicing membrane, and diced into separate chips which remain adhered to the membrane. The distance between chips at this point may be as little as about 20 µm or less.

In some embodiments, a transparent flat plate, which may be made of fused silica in order to be transparent to deep UV light, is coated with the photoactive polymer, and adhered to the chips on the dicing tape. The dicing tape or membrane is usually treated with a releasable adhesive whose adhesion is substantially weakened by UV irradiation or heating, so that if this pre-treatment is applied, then the chips will adhere to the photoactive polymer when a pressure of less than one to several N/cm$^2$ is applied at a temperature in the range of 130-150° C. The plate, called a donor plate, is thereby populated with chips, and is then ready to be positioned in a machine where the chips will be transferred to target substrates under the application of light and heat.

In many applications of the invention, several components are placed in one small area to make a circuit, which may be called a module or a micromodule, and is similar to what is known in the electronics packaging industry as a multichip module. The area occupied by the circuit may be about 0.5× 0.5 cm to about 3×3 cm; preferably about 1 to 2 cm square. The components, and hence the area of polymer to be irradiated behind each one, are typically between about 0.1 and 4 mm on each side; most commonly between about 0.2 and 1 mm. These components are placed in multiple target positions on a substrate which is as large as the processing machine can accommodate; it could, for example, be the size and shape of silicon wafers (such as 200 mm or 300 mm diameter), or it could be the size and shape of a typical PCB substrate (for example a rectangle of 300×450 mm). Other sizes are also possible.

Regardless of the substrate size, many micromodule circuits can be accommodated within one substrate. The time required for the operation of placing components onto the correct positions should be as small as possible for the lowest production cost. This time has three stages: substrate transport, alignment and placement. In a normal operation, the substrate which has just been processed is moved out and placed in a cassette, and a new one is moved onto the stage where it is clamped in place, typically by vacuum. Some pre-alignment may take place during this step. Then the intended target positions on the substrate are aligned with the matching components on the donor plate. The alignment may be automated, using some combination of machine vision systems and optical pattern recognition, or it may be manual, based on a visual display of alignment marks. This step is similar to the alignment of a wafer and mask in a photolithography contact aligner, and similar systems may be used in the present invention.

The process of transferring components is now initiated. As noted previously, there are different possible sequences of application of light and heat, and different ways to provide these stimuli. For example, the light may come from a focused or collimated laser beam which is rapidly scanned over the donor plate, or by projection of a large area source of light which covers the entire donor plate at once. If the transfers take place in parallel rather than sequentially, this stage may be faster than any of the others.

FIGS. 5A-5B illustrate flow charts for a parallel transfer process according to some embodiments. An array of chips can be disposed on a photoactivated thermal transfer layer on a donor plate. Multiple chips of the chip array can be simultaneously transferred to a substrate, for example, by applying a light and/or a heat to the locations of the photoactivated thermal transfer layer under the desired chips. Permanent transfer can be performed, e.g., transferring to a final substrate. Temporary transfer can be performed, e.g., transferring to another donor plate, e.g., a substrate having a photoactivated thermal transfer layer.

In FIG. 5A, operation 500 provides a donor plate, wherein the donor plate comprises chips disposed on a photoactivated thermal transfer layer, wherein the chips are disposed on a chip array. Operation 510 transfers multiple chips from the chip array to a substrate.

In order to perform a parallel transfer, the components can be prepared to be in correct lateral positions, e.g., multiple components can be aligned at a same time to different modules on a substrate. One way to achieve the simultaneous alignment is position the components so that the period of the module array is an integer multiple of a period of the chips on the donor plate. In one dimension, the period can include one period dimension, such as a x period. In 2 dimensions, e.g., lateral displacement for components on modules, the period can include a x period and a y period. The x period can correspond to a length, such as the x period of a module can correspond to a length of the module. The x period of a chip array on a donor plate can correspond to a length of one or more chips together with a spacing distance from the one or more chips to an adjacent one or more chips. The y period can correspond to a width, such as the y period of a module can correspond to a width of the module. The y period of a chip array on a donor plate can correspond to a width of one or more chips together with a spacing distance from the one or more chips to an adjacent one or more chips.

In FIG. 5B, operation 530 determines a period of a module array on a substrate. The period can include a length, a width, or a length and a width of a module. Operation 540 verifies that the period matches a period of a chip array on a donor plate, wherein the chip array is disposed on a photoactivated thermal transfer layer on the donor plate. For example, a length and a width of the module can be an integer multiple of a length period and a width period of chips in the chip array. Operation 550 simultaneously transfers at least one chip from each of the chip array to each module of the module array.

FIG. 6 illustrates a flow chart for a parallel transfer process according to some embodiments. Operation 600 determines a first period of a module array on a substrate. Operation 610 transfers chips on a first chip array on a first donor plate to a second chip array on a second donor plate, wherein a second period of the second chip array matches the first period, wherein the first and second chip arrays are disposed on a photoactivated thermal transfer layer on the first and second donor plates. Operation 620 transfers at least one chip from each of the second chip array to each module of the module array. Operation 630 repeatedly transfers for chips on a third donor plate to a fourth donor plate. Operation 640 repeatedly transfers for chips on the fourth donor plate to the module array.

A parallel transfer can occur only if all of the components to be transferred are simultaneously aligned to the correct target positions. The components have a spatial periodicity which is determined by their size and the size of the dicing street in between them. In the embodiments of the invention described above, there is no change of relative position as the components are transferred from the dicing membrane (on which they are received) to the donor plate.

For the transfer of the first type of component to the multichip micromodule, it is generally possible to arrange the target positions so that all of the targets are matched to a component in the correct place; this simply requires that the target period be an integer multiple of the donor period. However, when the second type of component is to be placed on the module, it is possible (and is under normal circumstances likely) that its spatial period is not the same as that of the first component, and so the components will not line up to the correct target positions.

One way to accommodate this mismatch is to effect the transfers sequentially, and to move the substrate relative to the donor plate in between each transfer. This takes extra time, since not only does mechanical motion have to occur each time over a distance given by the size of the target positions, and the machine has to then settle into a motionless state, but some misalignment is possible due to the motion, and at least part of the time it may be necessary to correct the error with a new alignment check. The machine size and complexity are also greater, since the substrate stage and donor plate holder must be able to move relative to each other over their entire length and width.

An array of components of different size (and hence different spatial periodicity) can be present on a donor plate. For example, the target array spatial periodicity can be 3.40, and the chip array periodicity is 0.408. If the first component is aligned with the correct position on the left, the left edge of the 9th component (the closest one to the next target position) is 3.264 units from the first, which is misaligned by 0.136 units.

For the sake of definiteness (without losing generality), the 0.008 units may be considered to be 20 µm (typical kerf width), and 0.4 unit chip width is 1 mm; the misalignment is 340 µm. The target period of 3.4 units represents 8.5 mm, and the larger chips are 2.105 mm.

The same array can be re-arranged to have a larger space between chips, e.g., since 3.4/8=0.425, an additional spacing of 0.025 units or 62.5 µm can be used to prepare the array to have the correct lateral positions in the donor plate for the parallel transfer process.

In some embodiments, the present invention discloses a chip separation process for photochemical component printing. The components can be fabricated, for example, on silicon wafers, and then transferred to donor plates on a layer of a photoactivated thermal transfer material. The components on the donor plates can be printed on modules on a substrate, for example, by applying light and heat to the appropriate components. To perform parallel printing, e.g., simultaneously transferring multiple components to multiple modules, with each component transferred to a module, the components on the donor plate will need to have a correct lateral separation. For example, a period of the module array, such as a length or width of a module, can be an integer multiple of the period of the component array, so that two components in the component array will have the correct spacing to be simultaneously transferred to two modules.

Figure 7:
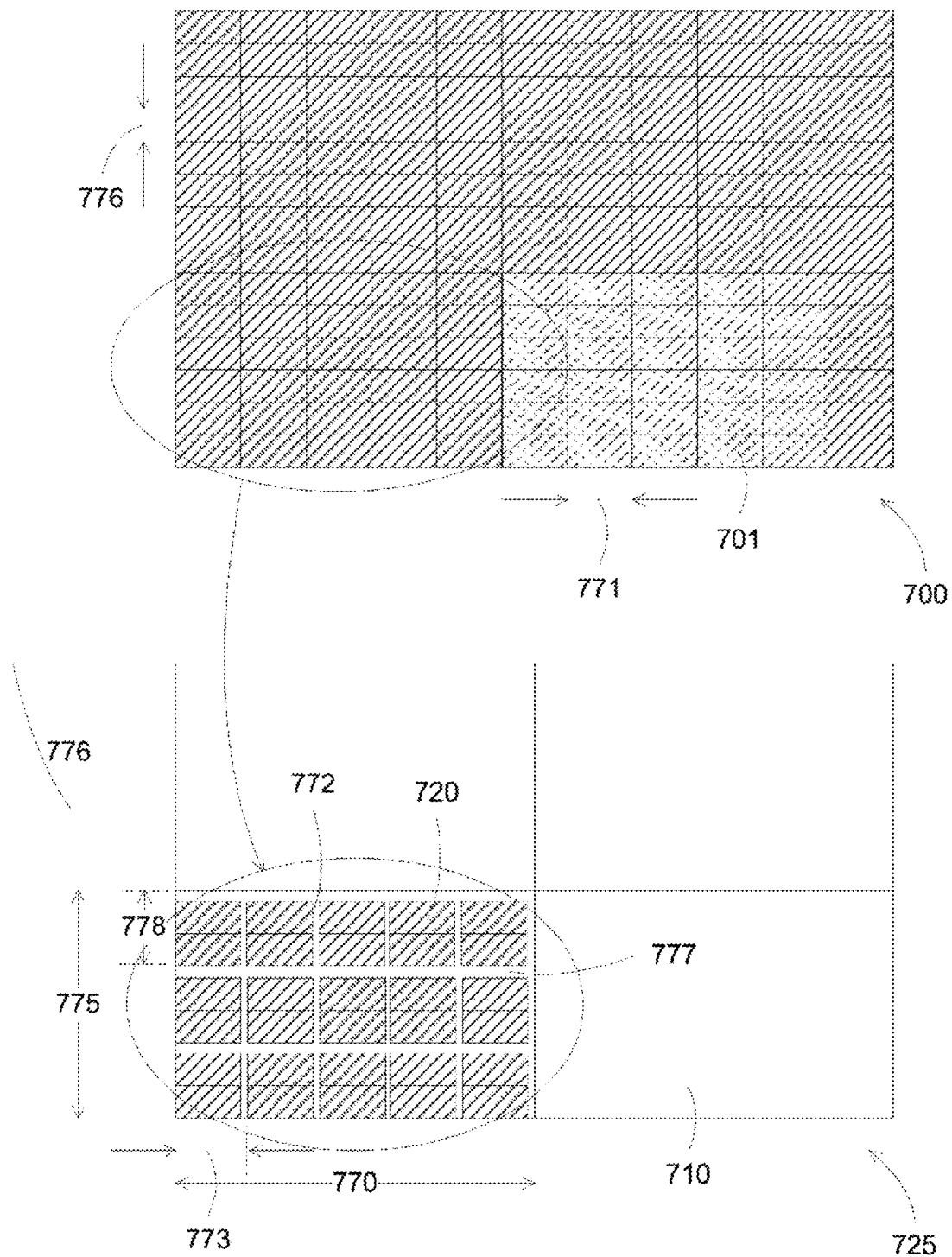
FIG. 7 illustrates a chip separation process according to some embodiments.

FIG. 7 illustrates a chip separation process according to some embodiments. Multiple chips 701 can be arranged on a substrate 700. For example, the chips 701 can be fabricated on a silicon substrate 700. Alternatively, the chips can be transferred to a donor plate 700, e.g., the chips are disposed on a layer of a photoactivated thermal transfer material. The chips 701 can be arranged in a chip array, having a period. For example, the period can include a x period, e.g., a length 771 of the chips. Thus the chips are arranged repeatedly with a period of chip length 771. Similarly, the period can include a y period, e.g., a width 776 of the chips. Thus the chips are arranged repeatedly with a period of chip width 776. Since the chips are arranged in an 2 dimensional array, the period of the chip array can include the x period of length 771 and the y period of width 776. This array of chips may not allow a parallel transfer to an array of modules with each module 710 having a length 770 and a width 775.

In some embodiments, the present invention discloses separating the chips so that a period of the new chip array matches with the length and width of the module. For example, the chips in the substrate 700 can be re-arranged, e.g., transferred to a donor plate 725, with additional spacing 772 and 777 between the chips. The additional spacing 772 and 777 can be determined based on the dimensions of the module 710. For example, the additional spacing 772 and 777 can be calculated so that the length 770 and width 775 can be an integer multiple of the periods of the new array. For example, the chips can be separated in a x direction with an additional spacing 772 between the chips, generating a period 773 of chip length 771 plus the additional spacing 772. The chips can be separated in a y direction with an additional spacing 777 between the chips, generating a period 778 of chip width 776 plus the additional spacing 777.

FIG. 8 illustrates a flow chart for chip separation according to some embodiments. Operation 800 provides a first donor plate. The first donor plate can include first chips disposed on an optionally photoactivated thermal transfer layer. The first chips can be disposed on a first chip array having a first period. For example, the first period can include a chip length and a chip width, if the chips are disposed next to each other. The first period can include a chip length plus a kerf width, and a chip width plus a kerf width, if the chips are fabricated with a kerf width between the chips.

Operation 810 determines a second period of a module array on a substrate. The second period can include a length and a width of a module. Operation 820 transfers the first chips on the first donor plate to a second donor plate, wherein the first chips are disposed on a photoactivated thermal transfer layer on the second donor plate, wherein the first chips are disposed on a second chip array on the second donor plate having the second period.

In some embodiments, the present invention discloses methods and systems for separating chips in an array on a donor plate. For example, after being fabricated, the chips can be disposed on a array with a x period equaled to a chip length plus a kerf width, and with a y period equaled to a chip width plus a kerf width. The chips can be re-arranged to be in a new array with a new period, e.g., new x period and/or new y period. The new period can be chosen to allow parallel transfer to an array of modules. Thus the new period can be selected so that the period of the module array is an integer multiple of the new period. For example, the x period of the new array can be elected so that the x period of the module array, e.g., the module length, can be an integer multiple of the x period of the new array. Similarly, the y period of the new array can be elected so that the y period of the module array, e.g., the module width, can be an integer multiple of the y period of the new array.

Different separation configurations can be used. For example, a separation distance, e.g., a spacing distance, can be added to each chip. Thus, each chip can be separated from the neighbor chips by the separation distance. A period of the new array can be the length (or width) of the chip plus the separation distance. Alternatively, a separation distance can be added to multiple chips. For example, if a separation distance is added to each two chips, then after every two chips, there is a separation distance. A period of the new array can be the length (or width) of the two chips plus the separation distance.

FIGS. 9A-9B illustrate a chip separation process according to some embodiments. FIG. 9A shows a cross section and FIG. 9B shows a top view of a chip separation process, from an original chip array 900 to a new chip array 901. The original chip array 900 can be disposed on a layer 910 of a photoactivated thermal transfer material on a donor plate 920. The original chip array 900 can include multiple chips 922, separating from each other by a length 972 (e.g., a x period of 972) and by a width (e.g., a y period).

The original chip array 900 can be transferred to a new array 901 on a layer 911 of a photoactivated thermal transfer material on a donor plate 921. An additional spacing 980 can be added to each chip 922*(chip 922* is chip 922 that has been transferred to donor plate 901), thus the new array 901 can include multiple chips 922*, separating from each other by a length 972 plus the spacing 980 (e.g., a x period of 973) and by a width plus a spacing (e.g., a y period).

The additional spacing 980 can be selected so that a length 971 of a module (or a period 971 of a module array) can be an integer multiple of the x period 973. For example, by adding the spacing 980, the length 971 can be 5 times the period 973. Without the additional spacing 980, 5 times the original period 972 would be smaller than the length 971 be a distance 985, thus preventing parallel transferring of chips to modules.

Similarly, a spacing can be added to the y direction, to increase the y period of the new chip array. For example, by adding a spacing, the width 976 can be 6 times the period. Without the additional spacing, 6 times the original period would be 975, which is smaller than the width 976 of the module, thus preventing parallel transferring of chips to modules.

FIGS. 10A-10B illustrate flow charts for a chip separation process according to some embodiments. In FIG. 10A, operation 1000 transfers while spreading chips uniformly from a first donor plate to a second donor plate, wherein the chips are disposed on a photoactivated thermal transfer layer on the first and second donor plates, wherein the chips are spread to achieve a periodicity of a module array on a substrate.

Figure 11A:
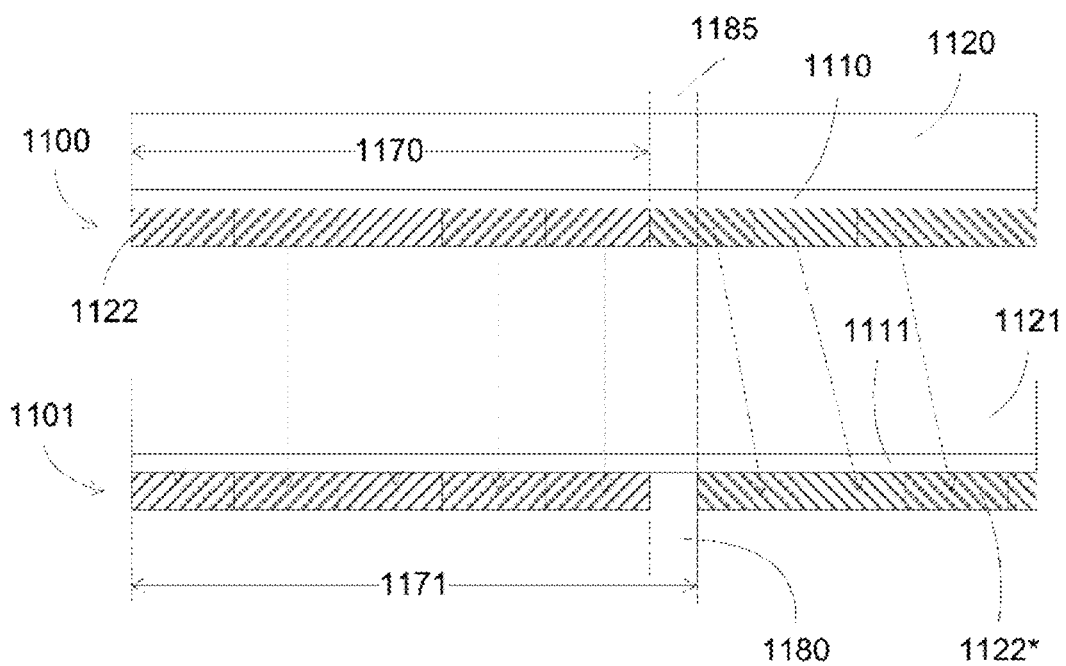
FIGS. 11A-11B illustrate a chip separation process according to some embodiments.
Figure 11B:
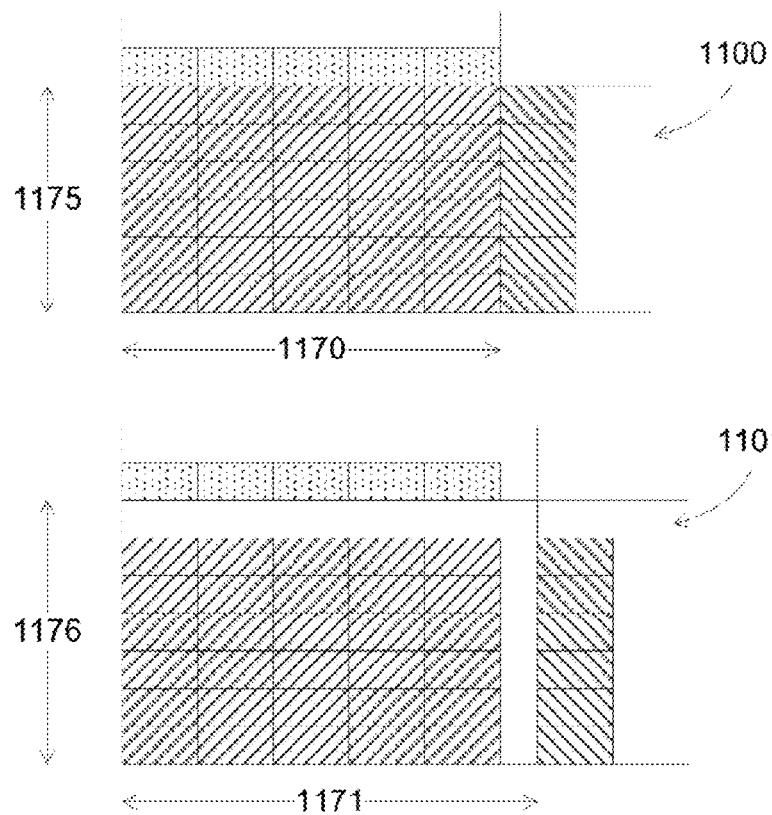

In FIG. 10B, operation 1020 provides a first donor plate, wherein the first donor plate comprises chips disposed on a photoactivated thermal transfer layer, wherein the chips are disposed on a first chip array having a first x period and a first y period. Operation 1030 determines a second x period and a second y period of a module array on a substrate. Operation 1040 transfers rows of the chips from the first donor plate to a second donor plate, wherein the rows are disposed on a photoactivated thermal transfer layer on the second donor plate, wherein the rows are disposed on a second chip array on the second donor plate having the second x period. Operation 1050 transfers columns of the chips from the first donor plate to a second donor plate, wherein the columns are disposed on a photoactivated thermal transfer layer on the second donor plate, wherein the columns are disposed on the second chip array on the second donor plate having the second y period FIGS. 11A-11B illustrate a chip separation process according to some embodiments. FIG. 11A shows a cross section and FIG. 11B shows a top view of a chip separation process, from an original chip array 1100 to a new chip array 1101. The original chip array 1100 can be disposed on a layer 1110 of a photoactivated thermal transfer material on a donor plate 1120. The original chip array 1100 can include multiple chips 1122, separating from each other by a length (e.g., a x period) and by a width (e.g., a y period).

The original chip array 1100 can be transferred to a new array 1101 on a layer 1111 of a photoactivated thermal transfer material on a donor plate 1121. An additional spacing 1180 can be added to each 5 chip 1122*(chip 1122* is chip 1122 that has been transferred to donor plate 1101), thus the new array 1101 can include multiple chips 1122*, separating from each group of 5 chips by a spacing 1180 (e.g., a x period of 1171) and by a width plus a spacing (e.g., a y period).

The additional spacing 1180 can be selected so that a length 1171 of a module (or a period 1171 of a module array) can be an integer multiple of the x period. For example, by adding the spacing 1180, the length 1171 can be the same as the period of the new chip array (e.g., 5 times the length of the chip 922 plus the spacing 980). Without the additional spacing 1180, 5 times the original period would be smaller than the length 1171 be a distance 1185, thus preventing parallel transferring of chips to modules.

Similarly, a spacing can be added to the y direction, to increase the y period of the new chip array. For example, by adding a spacing, the width 1176 can be 6 times the period. Without the additional spacing, 6 times the original period would be 1175, which is smaller than the width 1176 of the module, thus preventing parallel transferring of chips to modules.

FIGS. 12A-12B illustrate flow charts for a chip separation process according to some embodiments. In FIG. 12A, operation 1200 transfers chips in cells of a chip array as a group from a first donor plate to a second donor plate while extending a period of the chip array, wherein the chips are disposed on a photoactivated thermal transfer layer on the first and second donor plates, wherein the period is extended to achieve a period of a module array on a substrate In FIG. 12B, operation 1220 provides a first donor plate, wherein the first donor plate comprises chips disposed on a photoactivated thermal transfer layer, wherein the chips are disposed on a first chip array having a first period. Operation 1230 determines a second period of a module array on a substrate. Operation 1240 transfers chips in cells of the chip array from the first donor plate to a second donor plate, wherein the chips are disposed on a photoactivated thermal transfer layer on the second donor plate, wherein the cells are disposed on a second chip array on the second donor plate having the second period.

The process disclosed in U.S. Pat. No. 6,946,178 and U.S. Pat. No. 7,141,348 can be used to transfer components such as integrated circuit chips on a temporary basis as well as for placing them in a product. Thus, for example, a donor plate can be populated with chips, as described previously, and placed in a machine which aligns the donor plate to a temporary substrate. The chips come in a rectangular array, whose axes shall be denoted x and y. In the first step, the chips in one row along the x axis may all be transferred to the temporary substrate at once, using an irradiation and transfer mechanism as described in a co-pending application. The donor plate is then advanced relative to the substrate until the next row of chips is located over the desired y axis position, and this row is transferred. The separation of the two rows on the temporary substrate is greater than that of any two rows in the original array, and it is such that its spatial period now meets the requirement for parallel transfer to the intended product circuit array. The amount of separation may be different for each starting array (and will of course depend on the target array size as well), but it is typically a relatively small distance, because the component size is substantially smaller than the target size.

As an illustrative example, suppose the first chip has a length and width (including the dicing street) of 4.000 mm, and the target period is 20.000 mm. Every fifth chip in the donor array will line up correctly with a target position once the donor plate is properly aligned with the substrate. Now suppose the second type of chip has a length and width of 2.200 mm. Since the ratio of 20/2.2 is 9.09, the condition that this should be an integer is violated and parallel transfer cannot take place without adjustment. If the original separation of 2.200 mm is increased to 2.500 mm, however, every eighth chip will be properly aligned, and parallel transfer can occur over the entire substrate. The additional spacing is 300 µm, which is a relatively small adjustment to the normal periodic advance of the donor plate during the temporary transfer process. While these numbers comprise an arbitrary example, they illustrate that for commonly occurring dimensions, the required chip separation is not greatly different from the original. Another example is where a separation of 62.5 µm is required. In general, the required separation will be less than about 1 mm.

Once all the rows (aligned along the x axis) have been transferred in this way, the chips are picked up from the temporary substrate using a second polymer-coated donor plate, and the process is repeated with the orthogonal axis. For the second transfer, the substrate is a donor plate coated with the polymeric photoactivated thermal transfer material which is now the final donor plate which will be used to transfer the chips to the product substrate.

While the invention adds extra steps to the original process, it has several characteristics which make it easier to implement in high volume than the main micromodule fabrication process:

1) The transfer of each row takes place with a single alignment, and if the optical system is optimally designed an entire row can be transferred simultaneously, regardless of how many chips are in it. For example, it may be desirable to have chips which are 0.2 mm square, or smaller. A 300 mm wafer with such chips will have rows near the center containing approximately 1500 chips. Using the optical techniques described in the co-pending application, all 1500 may be transferred in one operation lasting substantially less than 1 second; optionally in as little as about 1 ms.

2) The advance of the donor plate relative to the temporary substrate is a substantially smaller distance than the advance which would have to occur for sequential transfer (which is the period of the product target); consequently it not only takes less time, but alignment is less likely to be lost. The acceleration and deceleration at a given throughput is smaller, resulting in smaller forces on the fixtures.

3) The components are all the same height, and both donor plate and substrate may be very flat (on the micron scale). Hence it is possible to control the separation very precisely and to adjust it to a very small value, without slowing the process or losing precision in the placement of the chips.

The invention is advantageously carried out using a cylindrical lens to image the optical pattern onto the donor plate. The lens need not be very wide (only wider than component size), but must be long enough to image the entire row or column. Cylindrical lenses with lengths greater than 300 mm are readily obtainable commercially.

Figure 13:
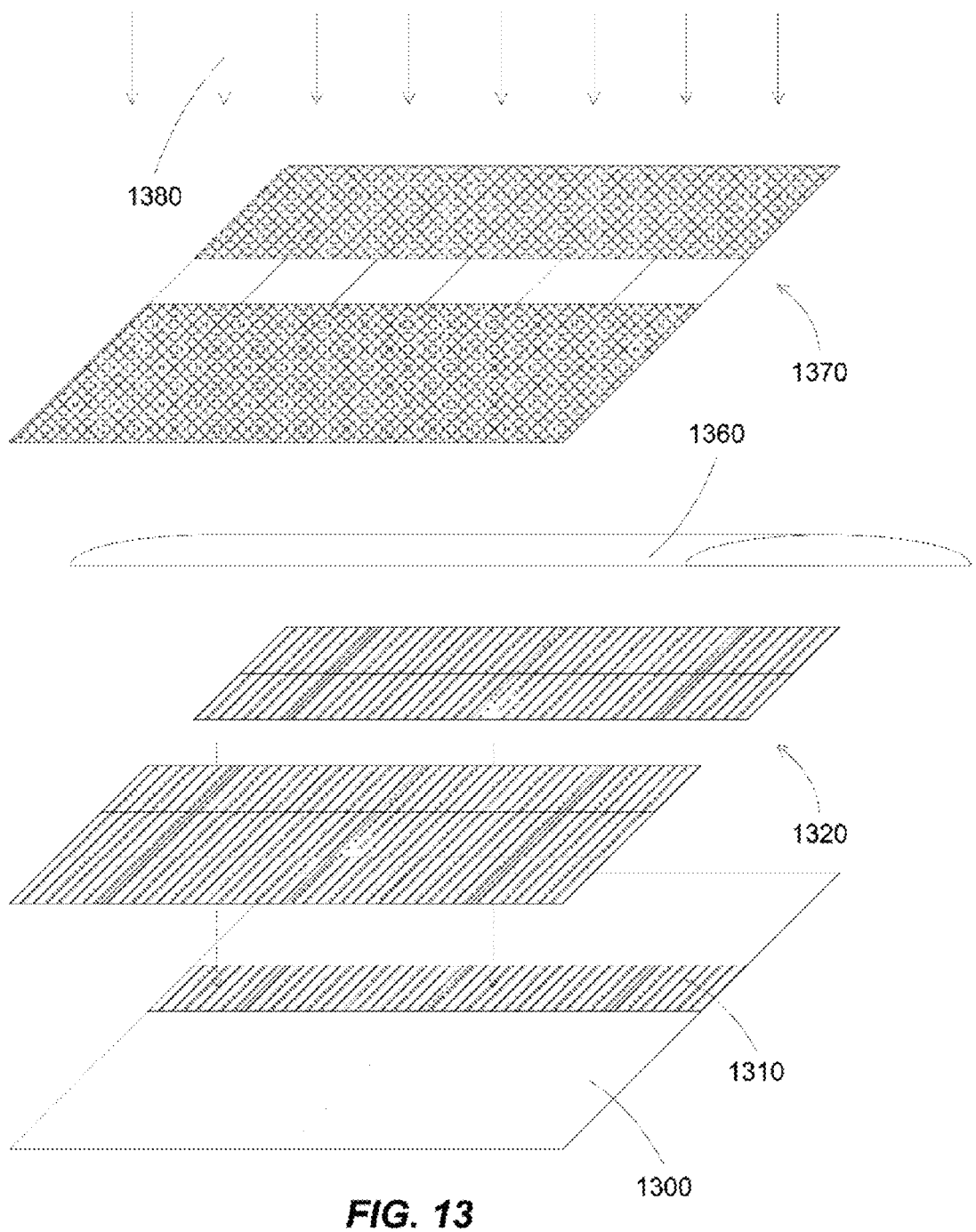
FIG. 13 illustrates an optical arrangement for transferring an entire row or column of components simultaneously according to some embodiments.

FIG. 13 illustrates an optical arrangement for transferring an entire row or column of components simultaneously according to some embodiments. The transfer can be performed by using a cylindrical lens 1360. Uniform illumination 1380 is normally incident on the mask 1370 (top) and is imaged onto the donor plate 1320 below, causing release of a row 1310 of components to a substrate 1300. The donor plate is then advanced relative to the mask by one component period, and the substrate is advanced by slightly more than the same amount, according to the requirement for increased spacing.

Figure 14A:
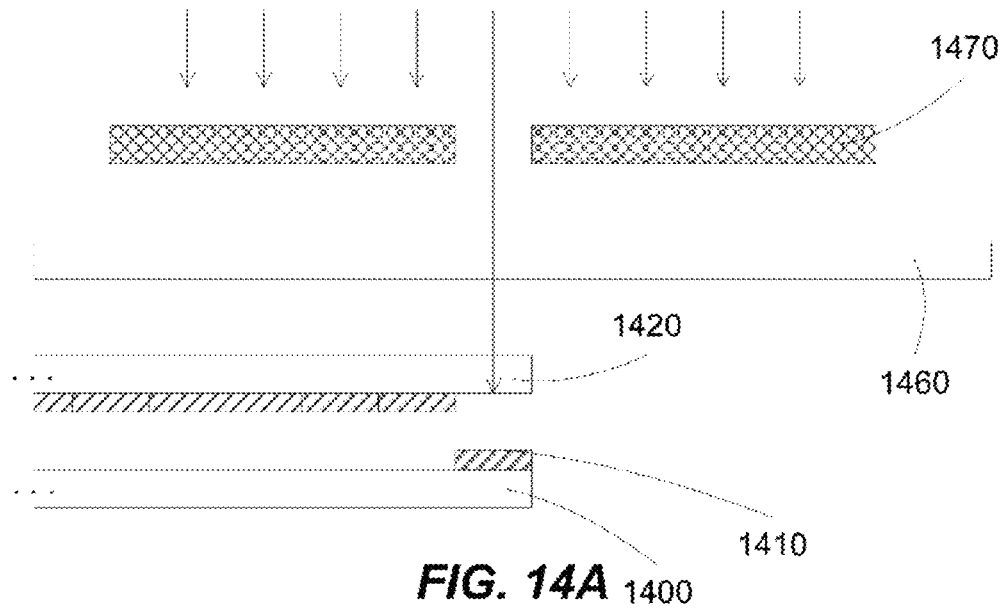
FIGS. 14A-14B illustrate a transferring process according to some embodiments.
Figure 14B:
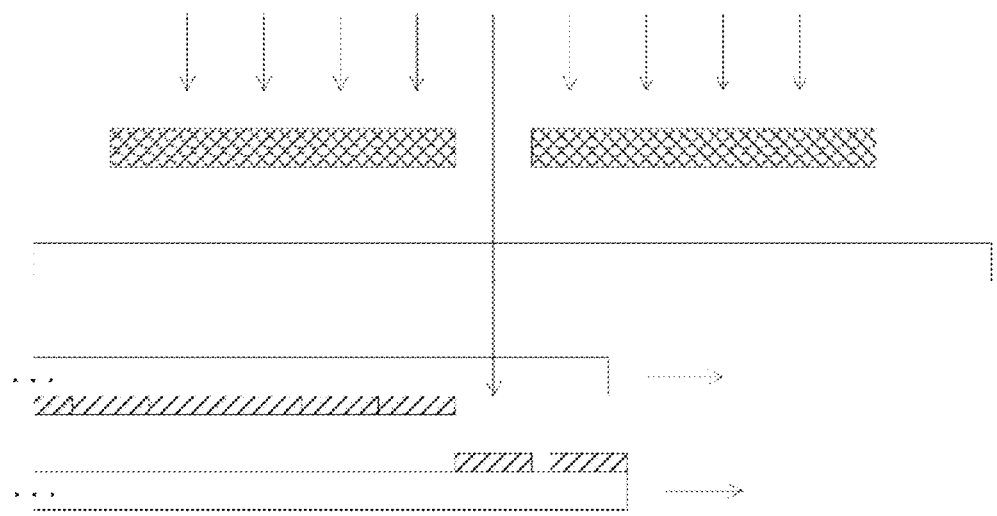

FIGS. 14A-14B illustrate a transferring process according to some embodiments. Cross section views are shown, indicating the relative motion of the donor plate 1420 and the substrate 1400. The mask 1470 and lens 1460 can remain fixed, while the donor plate 1420 moves to the right by one chip array period, and the substrate 1400 moves an additional amount corresponding to the extra spacing. The diagram shows the system after transfer of the first and second chips, ready for the donor plate and substrate to be moved for the next transfer.

The range of motion of the donor plate and substrate must encompass the entire width of the donor plate. The operation begins with one edge of the donor plate aligned with the mask pattern, and ends with the opposite edge so aligned. This is different from the motion of the donor plate and substrate for circuit fabrication, where the donor plate and substrate each are required to move laterally only one target array period.

Figure 15A:
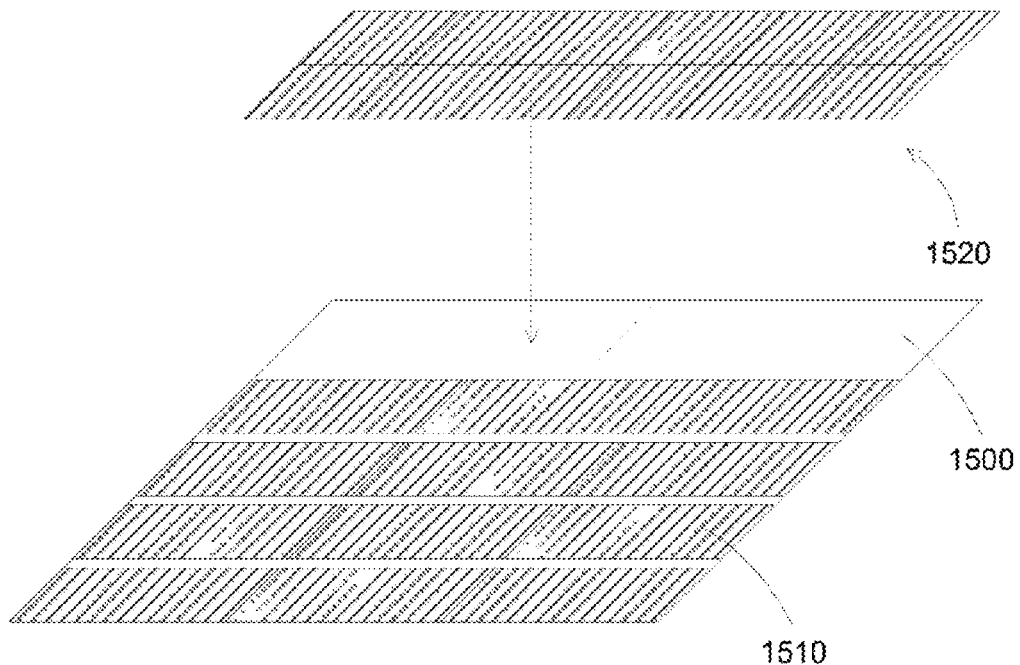
FIGS. 15A-15B illustrate a two dimensional transfer according to some embodiments.
Figure 15B:
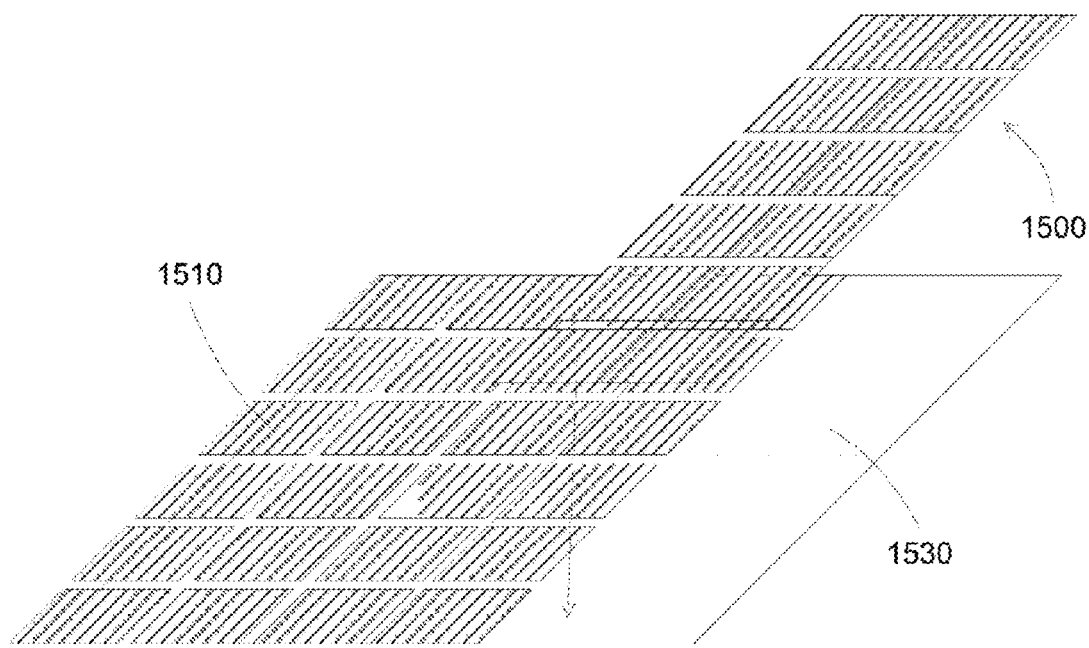

FIGS. 15A-15B illustrate a two dimensional transfer according to some embodiments. In FIG. 15A, a substrate 1520 can be used to simultaneously transfer rows 1510 to a donor plate 1500. An additional spacing can be added to each row, to form a new array with appropriate period for parallel chip transfer.

In FIG. 15B, the donor plate 1500 can be used to simultaneously transfer columns 1540 to a donor plate 1530. An additional spacing can be added to each column, to form a new array with appropriate period for parallel chip transfer.

Figure 16A:
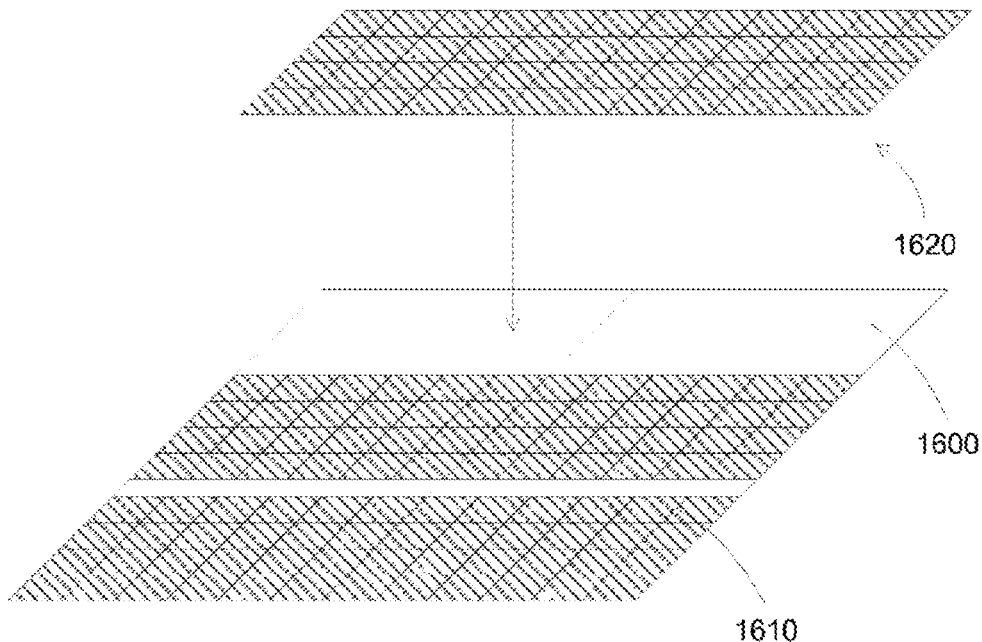
FIGS. 16A-16B illustrate a two dimensional transfer according to some embodiments.
Figure 16B:
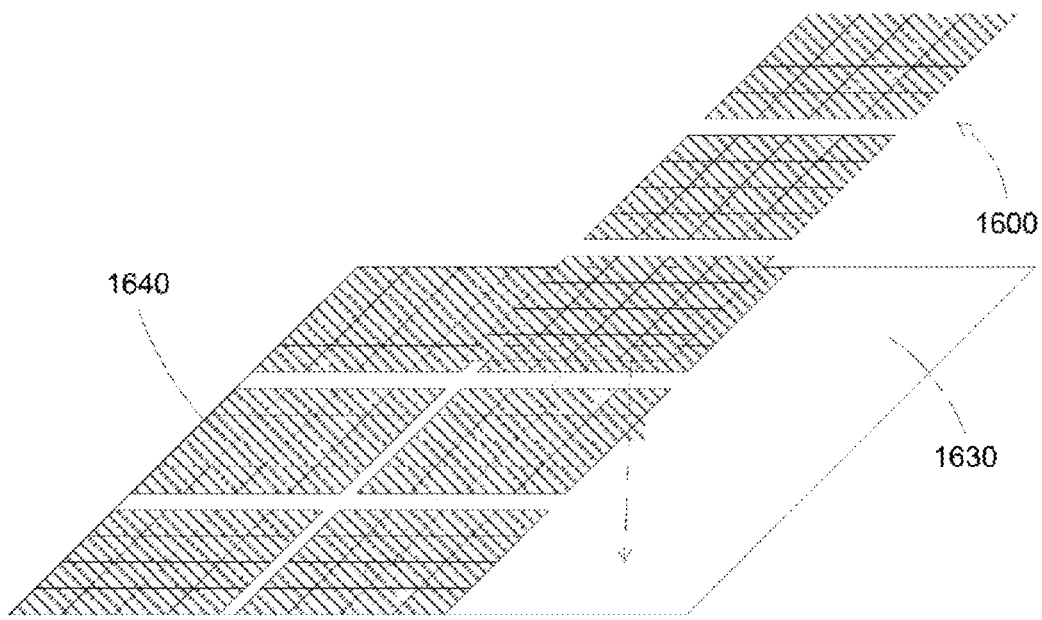

FIGS. 16A-16B illustrate a two dimensional transfer according to some embodiments. In FIG. 16A, a substrate 1620 can be used to simultaneously transfer rows 1610 to a donor plate 1600. An additional spacing can be added to each row, to form a new array with appropriate period for parallel chip transfer.

In FIG. 16B, the donor plate 1600 can be used to simultaneously transfer columns 1640 to a donor plate 1630. An additional spacing can be added to each column, to form a new array with appropriate period for parallel chip transfer.

FIG. 17 illustrates a flow chart for chip separation according to some embodiments. Operation 1700 transfers a row of chips from a first donor plate to a second donor plate, wherein the first donor plate comprises chips disposed on a photoactivated thermal transfer layer, wherein the row of chips are disposed on a photoactivated thermal transfer layer on the second donor plate. Operation 1710 moves the second donor plate with respect to the first donor plate, wherein the movement is configured to achieve a first separation that matches a first period of a module array on a substrate. Operation 1720 repeatedly transfers and moving for all rows of chips in the first donor plate. Operation 1730 transfers a column of chips from the first donor plate to the second donor plate. Operation 1740 moves the second donor plate with respect to the first donor plate, wherein the movement is configured to achieve a second separation that matches a second period of a module array on a substrate. Operation 1750 repeatedly transfers and moves for all columns of chips in the first donor plate.

In some embodiments, the donor plate and substrate stages may move continuously throughout the process for an entire donor plate, and need not be stopped at any time. For example, it is known that the photoactivated thermal transfer material decomposes in a time of the order of milliseconds or less. The distance over which a chip must move between the polymer film on the donor plate and the substrate is of the order of a few micrometers. Note that since all components are the same size, and the transfer process moves successively across the substrate, essentially no separation is required apart from that necessary to accommodate variations in thicknesses and other process variables.

The time required for a released chip to travel 5 microns is of the order of a few microseconds (~1 m/s), which is essentially instantaneous compared to the chemical reaction time. Suppose the donor plate moves at a rate of 1 mm/s. At the instant when the alignment is correct for transfer, with an appropriate advance calibrated to the measured release time, the row is irradiated. During 1 ms, the donor plate travels 1 μm. However, the substrate moves at almost the same rate (it must move relative to the donor plate by the desired spread between chips, which is less than, and often much less than, 1 mm). Thus the relative motion of the two objects is less than 1 μm/ms, and so control of the landing position to better than 1 μm is within the limits of the process. A dedicated machine can have a throughput of 1 300 mm diameter wafer about every 15 minutes (5 minutes for each of the two transfer runs, plus setup and alignment time). This calculation does not depend on the chip size; for a lateral dimension of ~100 μm, one wafer may contain more than 500,000 chips.

In some embodiments, the donor plate can advance after parallel transferring multiple chips to the modules. A second parallel transferring from the same donor plate to different modules can be performed. For example, the substrate can move to a new location, after a first parallel transfer. Multiple chips can be simultaneously transferred from the donor plate to new modules on the substrate.

Figure 18A:
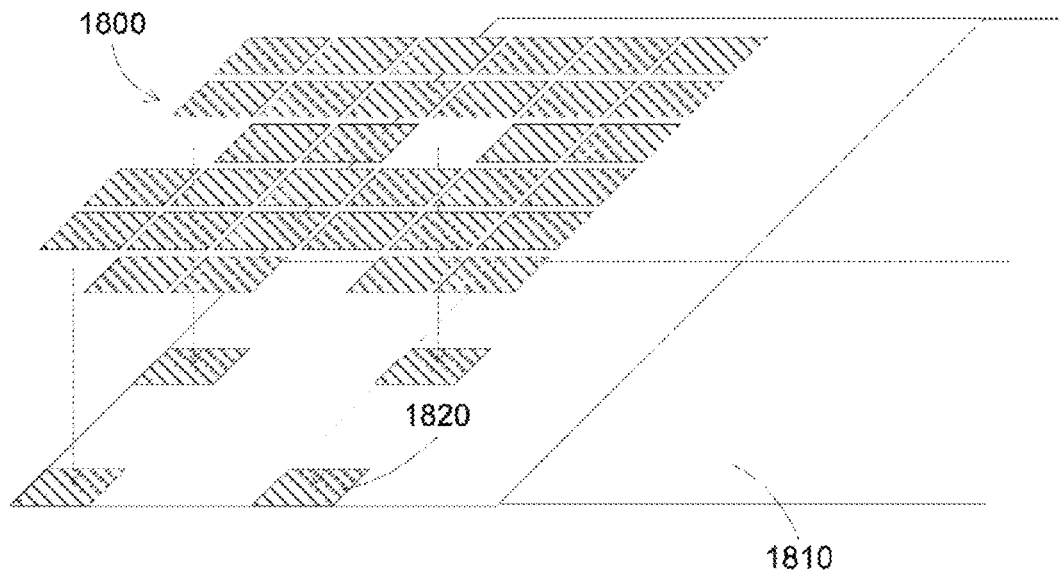
FIGS. 18A-18B illustrate a parallel transfer process according to some embodiments.
Figure 18B:
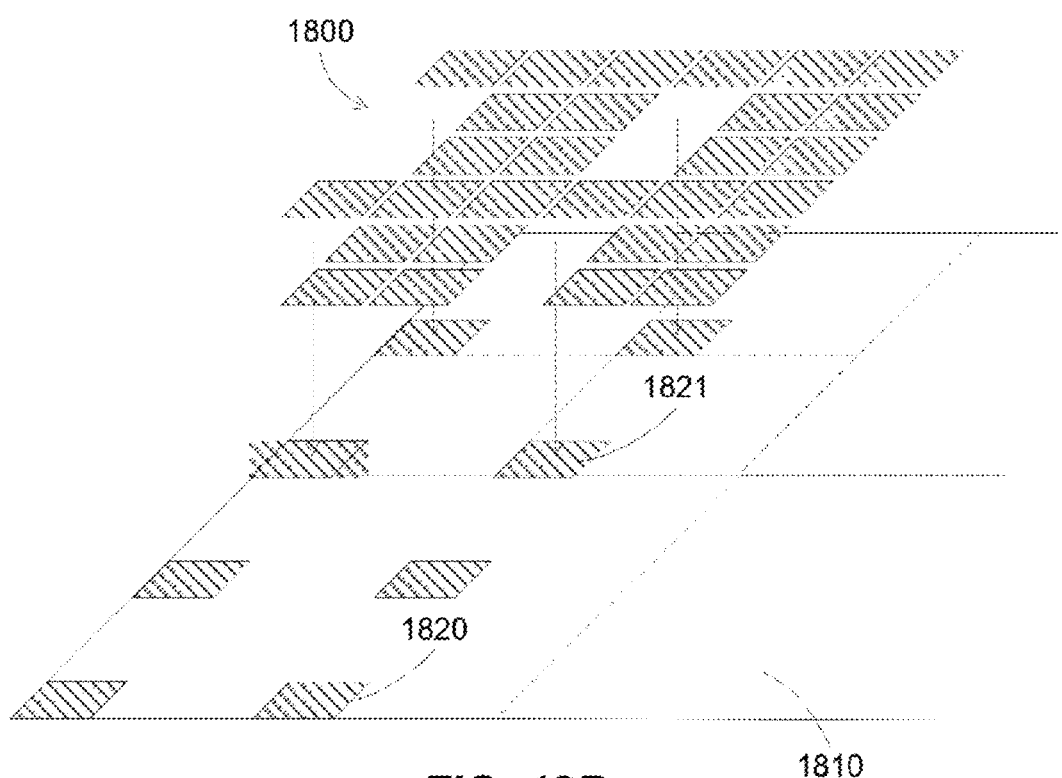

FIGS. 18A-18B illustrate a parallel transfer process according to some embodiments. In FIG. 18A, donor plate 1800 can be used to parallelly transfer multiple chips 1820 on multiple modules of substrate 1810. In FIG. 18B, the substrate 1810 can move, for example, to new modules that require chip transfer. The moving distance can include a length of the modules that have been printed, plus a distance of a chip, so that a chip 1821 on the donor plate 1800 can be available to be transferred.

In some embodiments, new donor plate can be used to transfer new components to the module. A first donor plate may or may not need to have the chip separated. For example, the period of a module array can be determined by the period of the chips on the first donor plate, thus the chip separation on the first donor plate can be already correct, and the chips do not need to be separated. Alternatively, if the period of a module array is already be determined, then the chips on the first donor plate can need to be separated, for example, so that the period of the module array can be an integer multiple of the period of the chips on the first donor plate. Since the period of the module has been determined after the first donor plate, the chips on the second and subsequent donor plates will need to be re-arranged to match with the module period. After re-arranged, the donor plates are ready for parallel transfer to the module array.

Figure 19A:
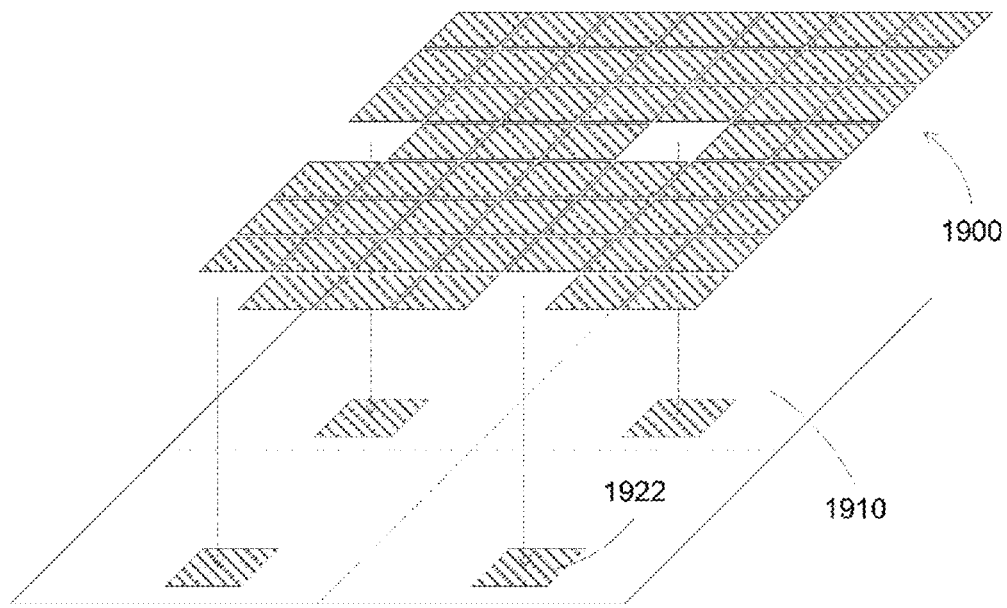
FIGS. 19A-19B illustrate a parallel transfer process for two donor plates according to some embodiments.
Figure 19B:
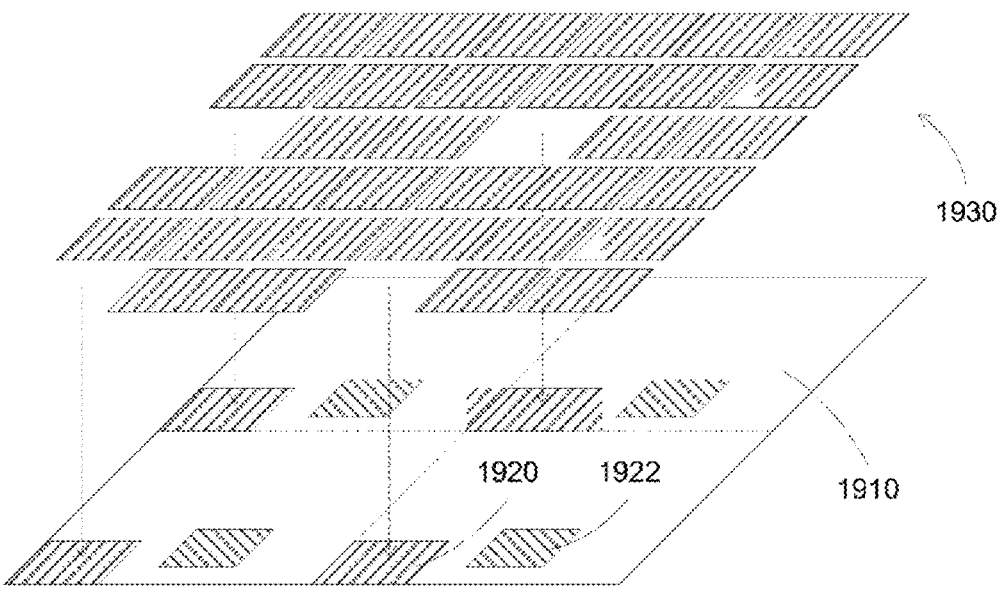

FIGS. 19A-19B illustrate a parallel transfer process for two donor plates according to some embodiments. In FIG. 19A, a first donor plate 1900 can be used to parallel transfer multiple chips 1922 to multiple modules 1910. The first donor plate 1900 can have the chips separated, e.g., an additional spacing can be added to the rows and columns of the chip array. In FIG. 19B, the modules 1910 can be moved from under the first donor plate to under a second donor plate 1930, which can be used to parallel transfer multiple chips 1920 to multiple modules 1910. The second donor plate 1930 can have the chips separated, e.g., a different additional spacing can be added to the rows and columns of the chip array.

In some embodiments, an alternative to increased spacing of the components is to use donor plates which are the size of the target area. Small donor plates which are the size of the target areas can be used to parallel transfer chips. The plates are held in a fixture so that once the fixture (having an array of plates) is aligned to the substrate, all chip positions are correctly aligned. This alignment depends only on the positions of the small donor plates and the target locations and not on the size or spacing of the chips in each donor plate array; any array of chips in each mini-plate will satisfy the requirement.

The space between target areas is just large enough to allow proper alignment as shown when the border of the mini-plate is accounted for. A border which cannot have components on it is needed for attaching the plate to the fixture.

Figure 20A:
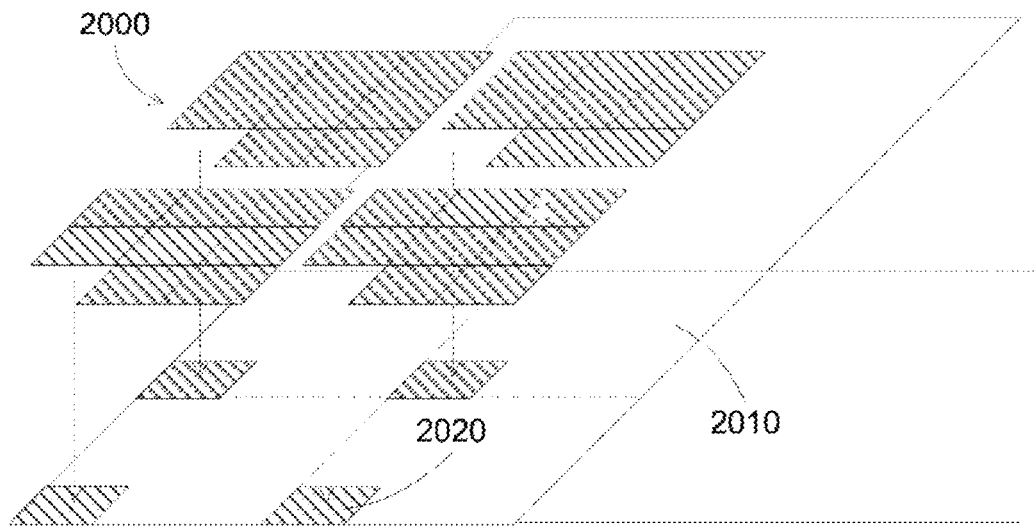
FIGS. 20A-20B illustrate a transfer process using small donor plates according to some embodiments.
Figure 20B:
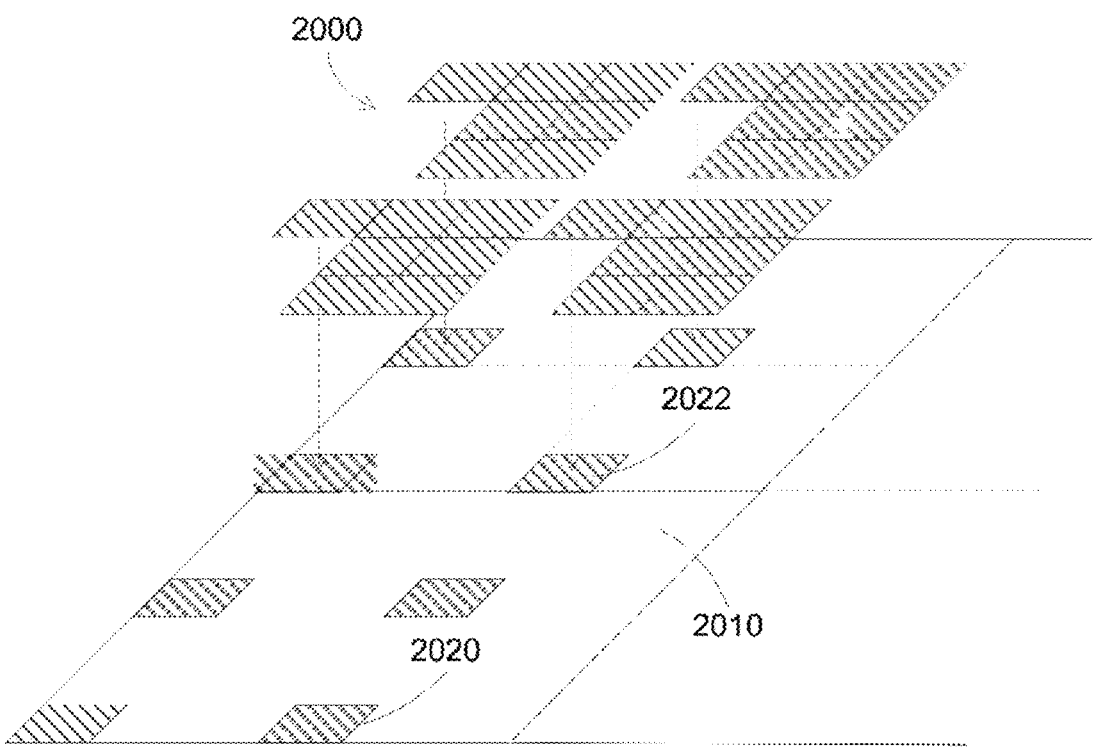

FIGS. 20A-20B illustrate a transfer process using small donor plates according to some embodiments. In FIG. 20A, multiple donor plates 2000, which can be the same size as the modules 2010, can be used for transfer chips 2020. In FIG. 20B, the substrate having the modules can move, and new chips 2022 can be transferred to new modules.

In some embodiments, a donor plate can correspond to multiple target areas, or multiple donor plates for one target area.

Figure 21A:
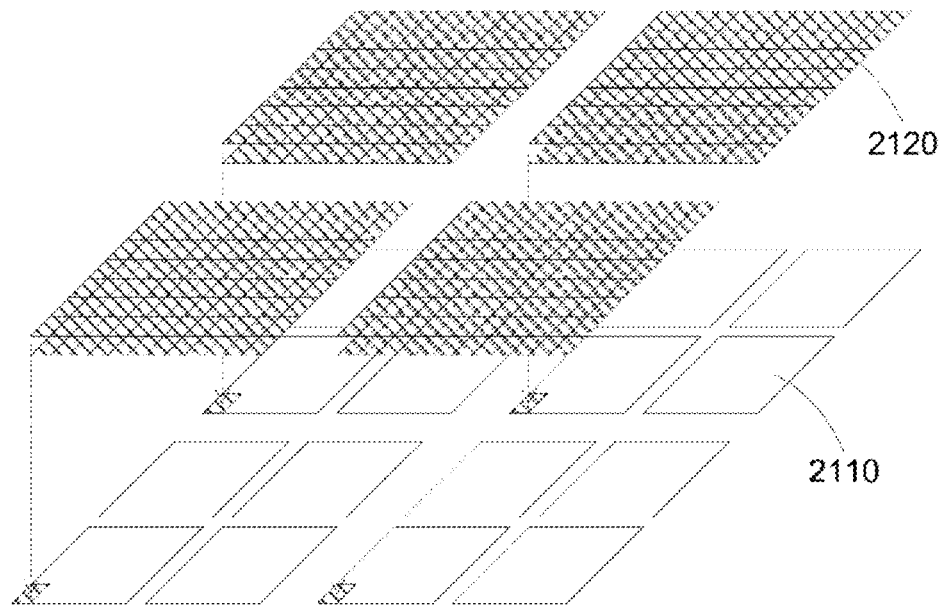
FIG. 21A illustrates a configuration of multiple target positions for each donor plate according to some embodiments.

FIG. 21A illustrates a configuration of multiple target positions for each donor plate according to some embodiments. The period of the donor plates 2120 is matched to the period of a set of targets 2110; in this case, a set of four. In order to transfer components to the other targets in the set, the alignment of the backing plate and substrate can be changed. This would happen a total of four times to fully populate this substrate.

In some embodiments, a donor plate can correspond to multiple target areas, for example, there are 4 targets per donor plate. Only one of the four will have the correct alignment for simultaneous chip transfers, but it is a relatively rapid process to realign the donor plate and substrate so that the next target location in each group is correctly aligned. Such a realignment can be accomplished much more quickly than unloading a substrate and reloading and aligning a new substrate; based on the speed at which the wafer chuck moves in a photolithography stepper, a time of the order of a second or less will typically be sufficient.

This configuration is particularly advantageous when the target area is small. Suppose, as an illustrative example, that the target area is 1 $cm^2$. There are several disadvantages to using donor plates with such a small area. There are four times as many as when the donor plate is 2 cm per side, leading to correspondingly more operations in the chip pickup process and while placing the donor plates onto the backing plate. The plates are also more expensive to fabricate, since edge structures for the holding process take up a larger fraction of the total plate area. In addition, the photopolymer coating process is more difficult, since most coating processes are easily adapted to large area and so become cheaper and more uniform as the coating area increases. With larger donor plates, these disadvantages are avoided. Throughput, defined as the number of substrates processed per unit time, is maintained at a value very close to that of the system with each donor plate corresponded to a target area, while the throughput defined as the number of targets processed per unit time is larger, by close to a factor of four.

The invention is not limited to any ratio of the number of donor plates per target area. For example, there may also be more mini-plates than targets, and the different plates aligned with one target area may contain different types of chips.

Figure 21B:
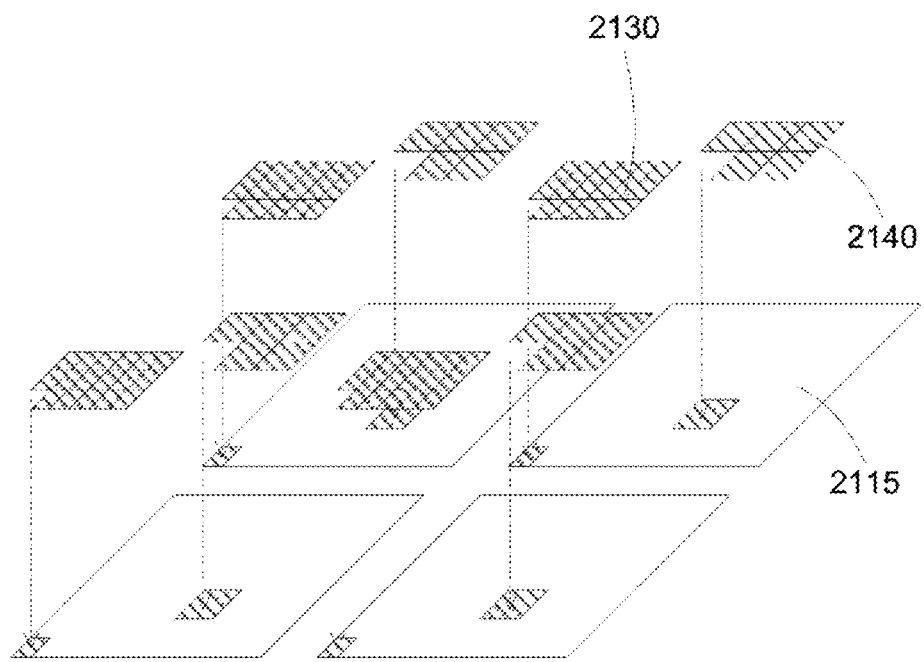
FIG. 21B illustrates a configuration of multiple donor mini-plates for each target according to some embodiments.

FIG. 21B illustrates a configuration of multiple donor mini-plates for each target according to some embodiments. In this case, two different types of components 2130 and 2140 can be transferred onto each target area 2115 without changing substrate or donor plate holder. If the desired location of the second component is sufficiently far away from the first on the target, the mini-plates may be separated as shown and all components can be transferred in a single exposure, with only one alignment. If the second component needs to be placed close to the first, so that it would not be possible to carry out the transfers simultaneously because the donor mini-plates cannot overlap, the first component would be transferred to all targets in a first alignment, and then the second component would be aligned and transferred. This procedure is favorable to throughput since it maximizes the number of transfers for one loading of substrate and donor plate holder. For the case in which all components are transferred at once, there is some penalty in that some space in the area defined by the target will not be occupied by components on the donor mini-plate holder, so the holder will be depleted and have to be replaced by a fresh holder sooner. The operator may determine which approach is better according to the details of the component sizes and target locations. If the two types of component are transferred in two separate alignments, however, there is no such restriction; the mini-plates can be shaped so as to fill the area. It should be noted that while the diagrams have shown square arrays, the invention is not limited to this or any other shape for the targets or the mini-plates.

The arrangement can be particularly advantageous when two different components are of very different sizes. For example, a circuit may require a microprocessor (relatively large, e.g. of the order of 1 mm square or more) and several capacitors (which may be 01005 sizes, 200×400 µm). Ten capacitors will fit into the same area as one microprocessor (even more if the microprocessor is larger than 1 mm$^2$). Therefore it will be very advantageous to be able to place the capacitors in the same loading/unloading step as the microprocessor. Alternatively, if several different sizes of capacitor are required, these may be incorporated into several different mini-plates and all placed in a single load/unload step.

FIG. 22 illustrates a flow chart for parallel transfer according to some embodiments. Operation 2200 determines first x and y periods of a module array on a substrate. Operation 2210 transfers chips on a first chip array on a first donor plate to a second chip array on a second donor plate, wherein second x and y periods of the second chip array matches the x and y periods, wherein the first and second chip arrays are disposed on a photoactivated thermal transfer layer on the first and second donor plates. Operation 2220 transfers at least one chip from each of the second chip array to each module of the module array. Operation 2230 optionally moves the substrate relative to the second donor plate. Operation 2240 optionally transfers at least one chip from each of the second chip array to each module of the module array. Operation 2250 optionally transfers chips from a third donor plate.

In some embodiments, the present invention discloses methods and systems for separating chips in a substrate using mini-donor plates. For example, the chips in the chip array can be transferred to multiple mini-donor plates. The mini-donor plates can be the size of the target area. A small additional amount of space must be introduced between target areas, so that the donor plates (which have to be held in some fixture) are correctly aligned, but this space may be small compared to the target size; e.g. about 1 mm compared to the target width of about 20 mm. Thus the throughput of the process (which is maximized by having as many targets on one substrate as possible) is minimally affected, while the necessity of separate processing to spread out the chips is eliminated.

The use of mini-plates is facilitated by the use of a temporary holding fixture during the process of picking up the chips from the wafer. If the chip pickup process were carried out as a separate operation for each mini-plate, it would greatly lower the throughput of this process, since there may be many (for example about 100-200) mini-plates per wafer. However, the mini-plates may be held in a close-packed array on a vacuum chuck, and if the sides of the mini-plates are polished with suitable care, the plates will fit together with essentially no space in between, and the array will pick up the chips from the dicing tape in the same way as would happen with a monolithic donor plate, thereby maximizing the throughput of the machine which carries out this operation. It is also possible to populate the mini-plates individually or in an array with any number of plates less than the total.

Figure 23:
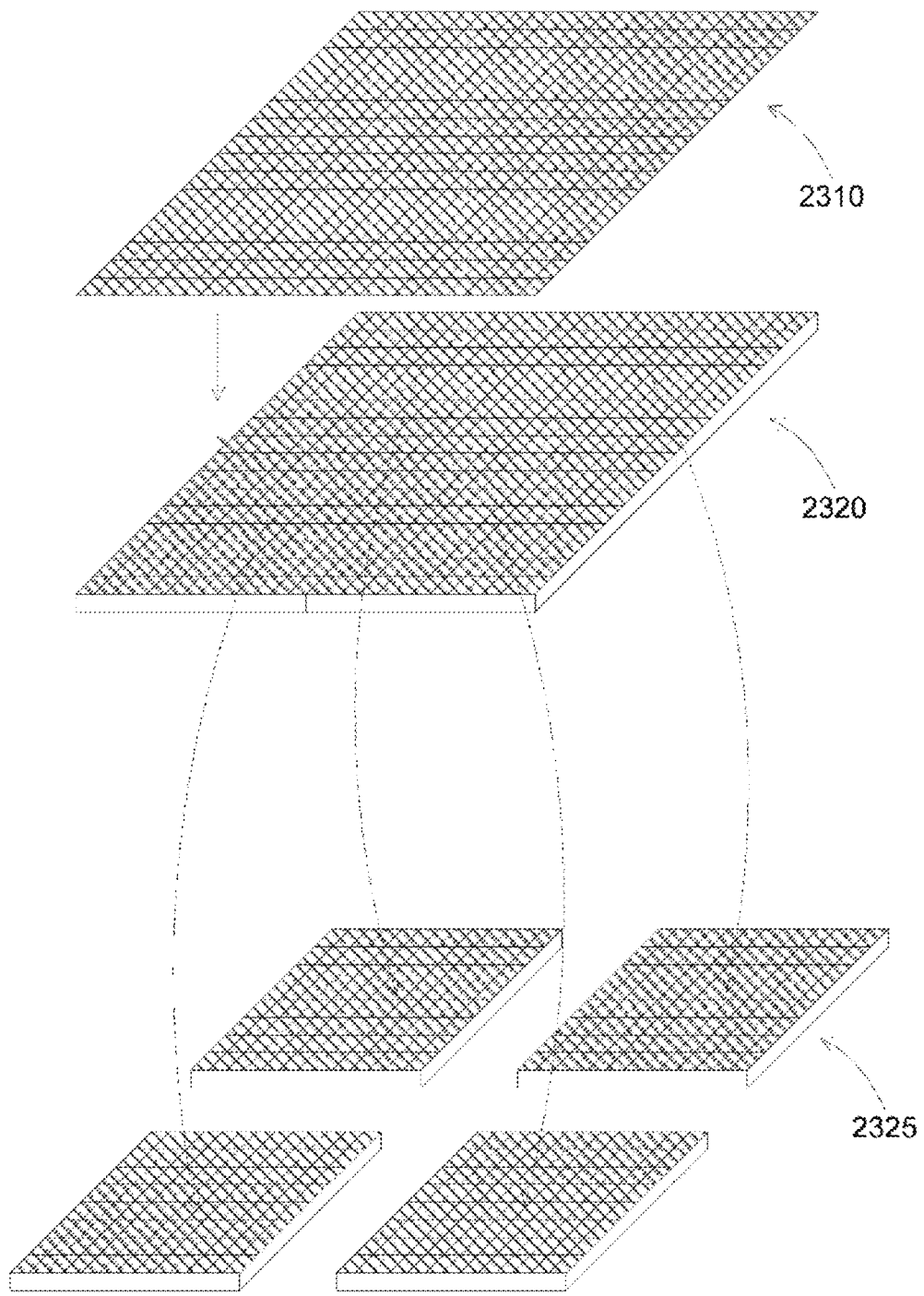
FIG. 23 illustrates a transfer process to mini donor plates according to some embodiments.

FIG. 23 illustrates a transfer process to mini donor plates according to some embodiments. An array of chips on a substrate 2010 can be parallel transferred to multiple mini donor plates 2325, which are seamlessly assembled together to form a substrate 2320.

In some embodiments, the mini donor plates can have features at the edge which take up some area that cannot be used for chip attachment. Thus the mini donor plates cannot be placed in a close-packed array during the chip pickup process, since there would be chips under the edge areas. It is possible to populate the plates individually; however this would reduce throughput for this machine. Alternatively, the plates may be placed on a checkerboard array, in which alternating positions are left empty. In this way only two chip pickup operations are required for one wafer. The mini-plates have a corner removed so that the diagonal corner edges fit together.

Figure 24A:
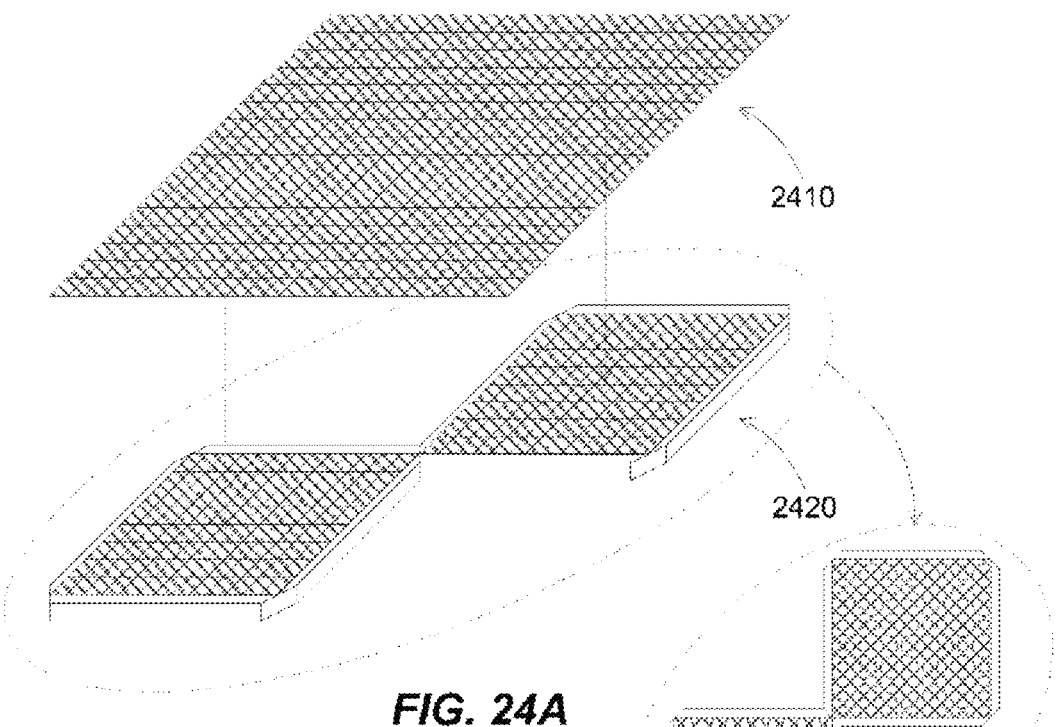
FIGS. 24A-24B illustrate a process for a checkerboard transfer according to some embodiments.
Figure 24B:
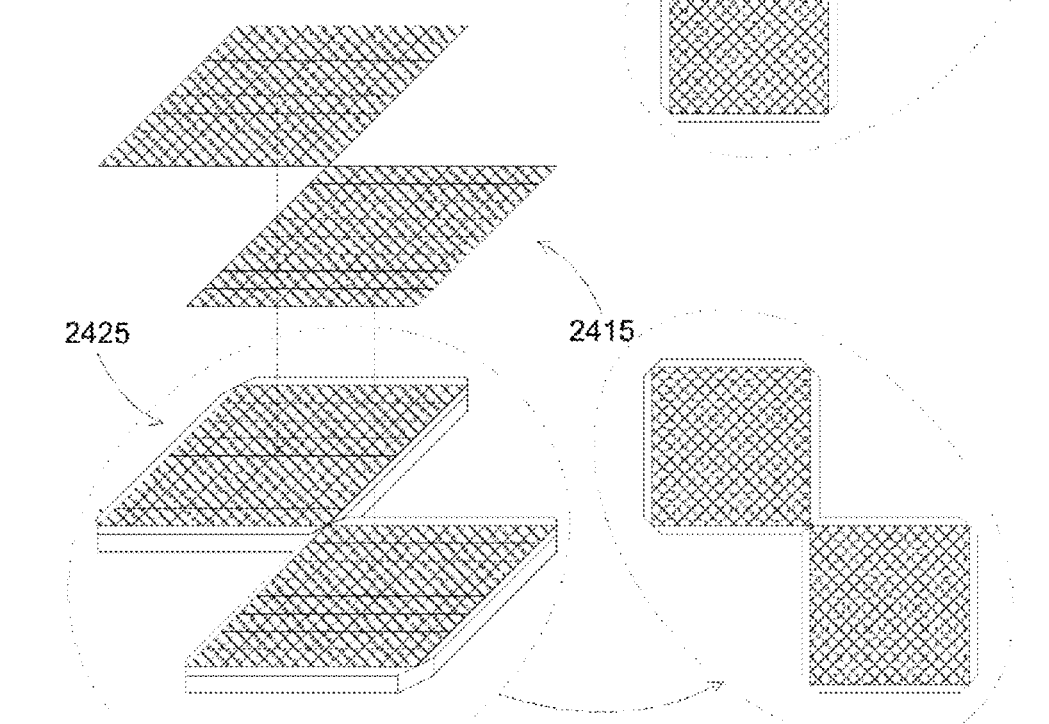

FIGS. 24A-24B illustrate a process for a checkerboard transfer according to some embodiments. The mini donor plates can be used during the chip pickup process, and can have a border strip which cannot be populated with chips. The corners of the mini-plates are truncated along the diagonal line so that they fit closely together along this line. This area is not used by any structure in the holding mechanism. In order to avoid picking up chips which are around the edge in the area of the strip, the photoactive polymer coating process excludes this area.

In FIG. 24A, a chip array 2410 can be used to transfer chips to a first configuration of checkerboard configurations, e.g., alternating rectangle array pattern 2420. In FIG. 24B, the remaining chip 2415 can be used to transfer chips to a second configuration of checkerboard configurations, e.g., other alternating rectangle array pattern 2425. For example, a checkerboard can have two configurations, a red configuration of alternating squares (or rectangles), and a black configuration of other alternating squares (or rectangles).

FIGS. 25A-25B illustrate flow charts for parallel transfer according to some embodiments. In FIG. 25A, operation 2500 transfers multiple arrays of chips from a first donor plate to multiple separate second donor plates, wherein the multiple arrays of chips are disposed on a photoactivated thermal transfer layer on the first donor plates, wherein the multiple arrays of chips are configured to be disposed on a photoactivated thermal transfer layer on the second donor plates. Operation 2510 separates the multiple second donor plates.

In FIG. 25B, operation 2530 transfers first multiple arrays of chips from a first donor plate to first multiple separate second donor plates, wherein the first multiple separate second donor plates are arranged in a first configuration of a checker board configurations, wherein the first multiple arrays of chips are disposed on a photoactivated thermal transfer layer on the first donor plates, wherein the first multiple arrays of chips are configured to be disposed on a photoactivated thermal transfer layer on the second donor plates. Operation 2540 transfers second multiple arrays of chips from the first donor plate to second multiple separate second donor plates, wherein the second multiple separate second donor plates are arranged in a second configuration of a checker board configurations, wherein the second multiple arrays of chips are disposed on a photoactivated thermal transfer layer on the first donor plates, wherein the second multiple arrays of chips are configured to be disposed on a photoactivated thermal transfer layer on the second donor plates.

In some embodiments, during the component transfer process, the mini-plates must be held in fixed positions in a single array in order for the alignment to work. The fixture must be flat and allow for the surfaces of the plates to all be in a single plane corresponding to the image plane of the optical irradiation system, and it must allow the transmittance of deep UV (e.g. 248 nm or 266 nm) light through all the plates. It should be possible to load the mini-plates into it easily with proper alignment.

Figure 26A:
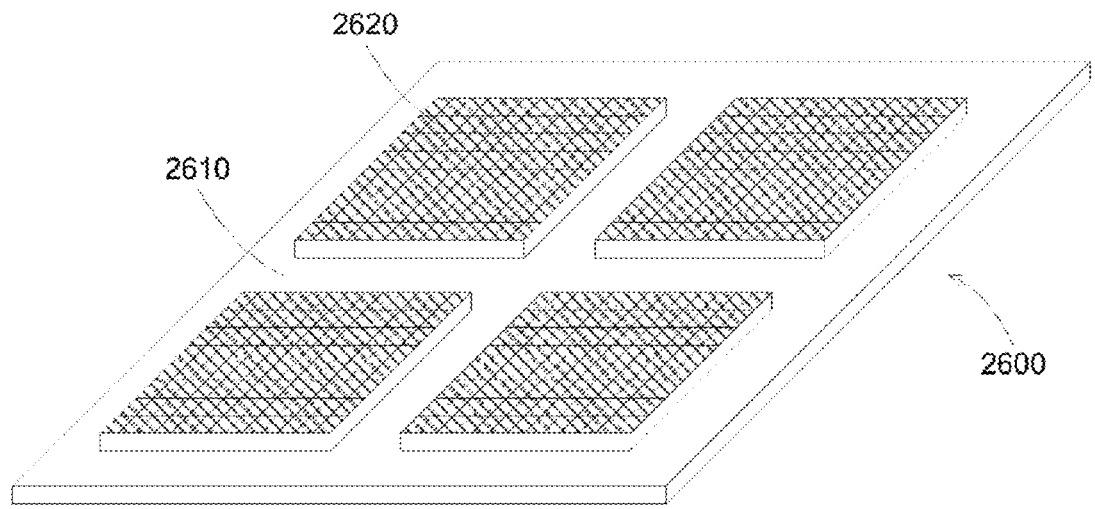
FIGS. 26A-26B illustrate fixtures for supporting mini donor plates according to some embodiments.
Figure 26B:
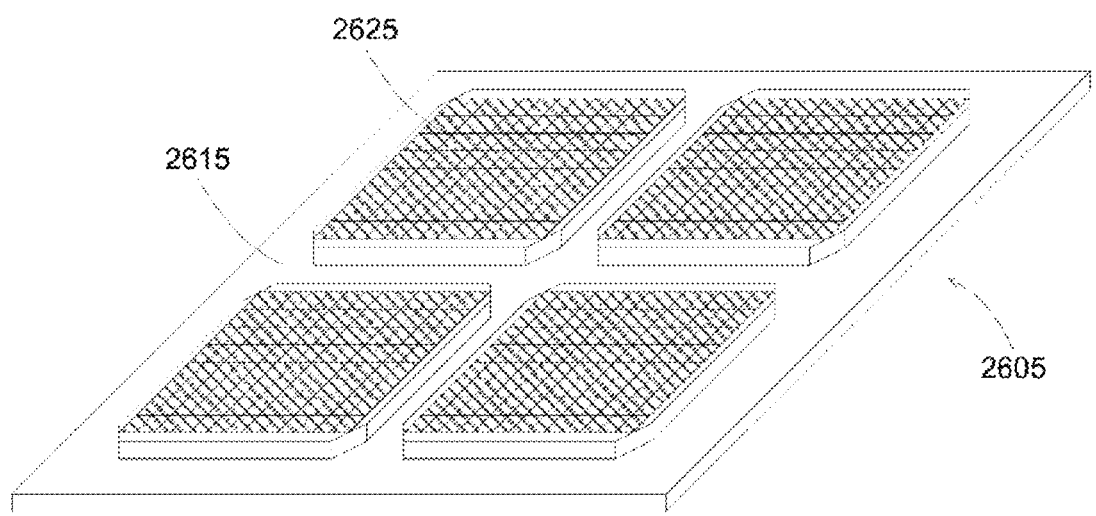

FIGS. 26A-26B illustrate fixtures for supporting mini donor plates according to some embodiments. In FIG. 26A, a fixture 2600 can include a plate 2610 in which multiple mini donor plates 2620 are secured. The mini donor plates 2620 can have no border edges. In FIG. 26B, a fixture 2605 can include a plate 2615 in which multiple mini donor plates 2625 are secured. The mini donor plates 2625 can have border edges, with chamfered corners for checkerboard chip pickup.

The mini-plates could be attached to a holding plate by an adhesive. This could be relatively time-consuming since the adhesive would not only have to be carefully applied but removed after each use. The removal and cleaning materials might or might not be the same materials as those used to clean the used donor plates for re-coating.

It is very difficult to make a typical vacuum chuck such as is used to hold wafers for exposure in photolithography which is transparent: the channels required for the vacuum would tend to scatter light. But if the vacuum nozzles are placed only around the perimeter of the plate; for example in a strip about 1 mm wide), they would not take up enough area to impact the process throughput significantly. Suppose the holes are 0.5 mm diameter (in order to fit within a 1 mm strip), on 1 mm centers. The holes around a 20 mm square plate would then have 15.7 mm² total cross-sectional area, and 105 N/m² atmospheric pressure results in 1.57 N total force against the plate. Fused silica plates of 2 cm×2 cm area, 1 mm thick have a mass of about 1.1 g, which require a force of ~$10^{-2}$ N to counter the force of gravity. Thus a vacuum holding mechanism using only the perimeter is feasible.

The vacuum may be applied through a set of interconnected channels in the backing plate which are fabricated by micromachining techniques such as are commonly used for making microscale fluidic systems, or so-called "lab on a chip" objects. If all of the backing plate area is served by one vacuum nozzle, the channel may be sealed by a variety of mechanical means, since it can be placed to one side of the plate where it does not obscure the irradiation even if it is relatively large.

It is also possible to have the vacuum for each donor plate separate. The channel which feeds each plate can be evacuated using an elastomeric vacuum nozzle applied to the backside of the backing plate during donor plate loading, and then sealed by a micromachined valve. Examples of such a valves are described by A. T. Evans and Y. B. Gianchandani in the Review of Scientific Instruments, vol. 81, paper 066105, 24 Jun. 2010; and by A. Debray, et al., in the proceedings of the Fifth International Workshop on Micro and Nanotechnology for Power Generation and Energy Conversion Applications, Nov. 28-30, 2005, pp. 198-201. It is also possible to generate a vacuum by vacuum generators incorporated into each plate, using micromachined vacuum pumps such as are described, for example, by N. K. Gupta, et al., in the proceedings of the 25th International Conference on Micro Electro Mechanical Systems: IEEE MEMS 2012, Paris, France, 29 Jan.-2 Feb. 2012, pp. 152-155.

Figure 27A:
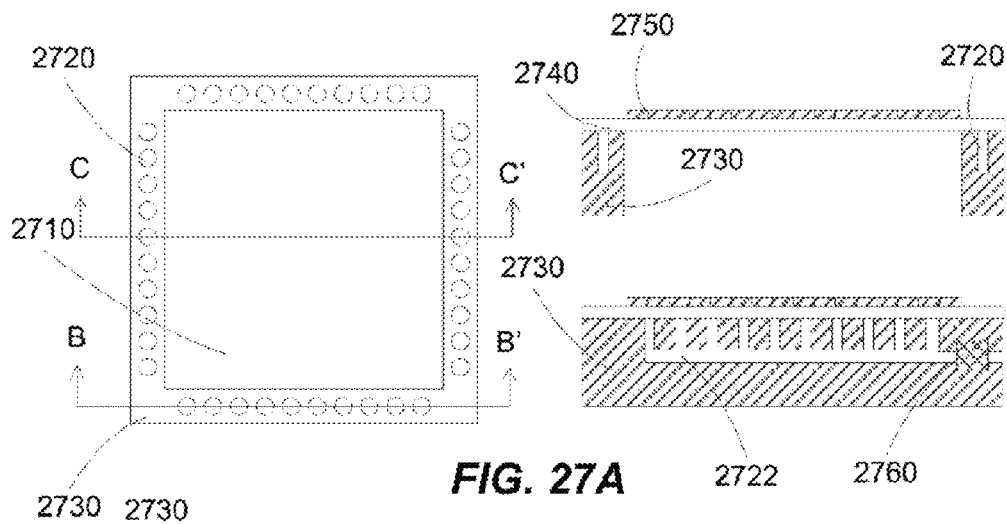
FIGS. 27A-27B illustrate vacuum backing plates according to some embodiments.
Figure 27B:
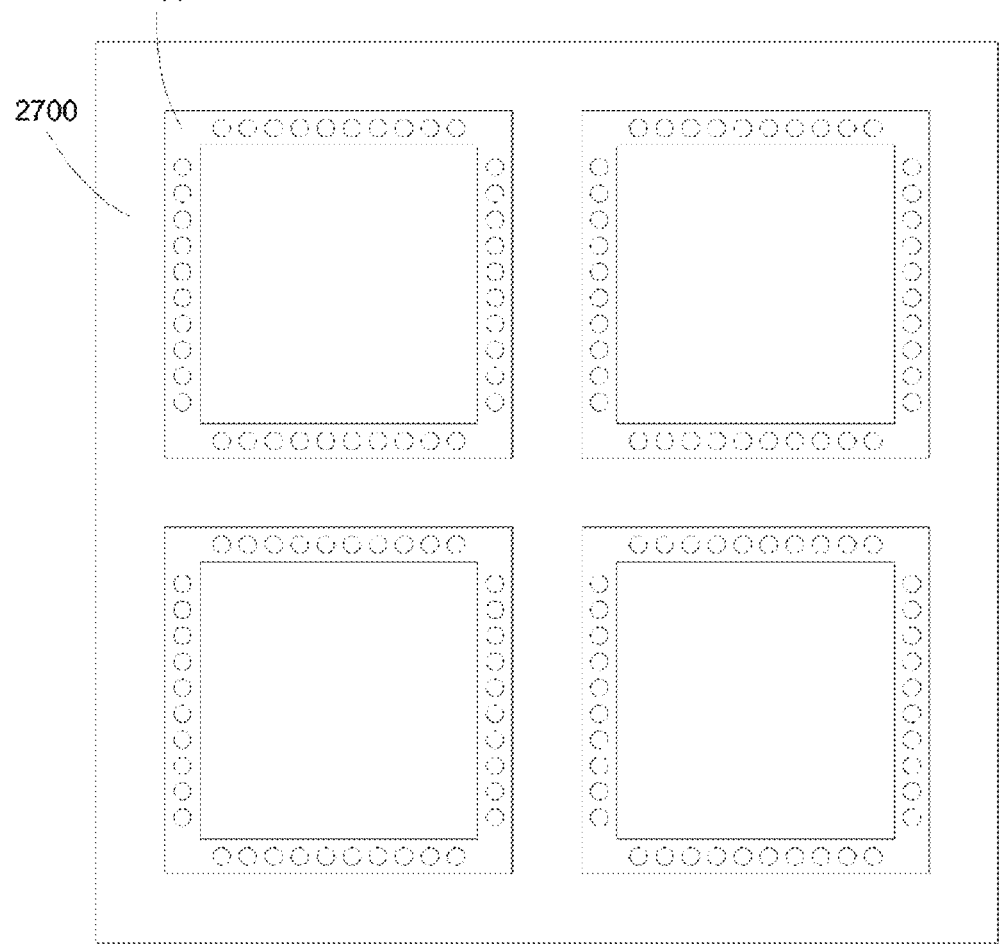

FIGS. 27A-27B illustrate vacuum backing plates according to some embodiments. The backing plate consists of an array of such sections, corresponding to the array of targets, so that each donor plate is held against the backing plate by vacuum nozzles around its perimeter. The area inside the inner square is available for holding chips. The nozzles are about 0.5 mm diameter (between about 0.2 and about 0.8 mm), and connect to a common manifold underneath as shown in the cross-section. A micromachined valve may be placed at one corner to allow evacuation and sealing, as shown below right, or there may be only a single exit channel and valve for the entire backing plate.

A backing plate 2730 can have multiple vacuum nozzle 2720, which can be disposed at a periphery of chip area 2710. A donor plate 2740 can have multiple chips 2750, and can be held against the backing plate by the vacuum nozzles. Vacuum path 2722 and vacuum valve of vacuum pump 2760 can be integrated. Multiple backing plates can be installed in a plate 2700.

Figure 28A:
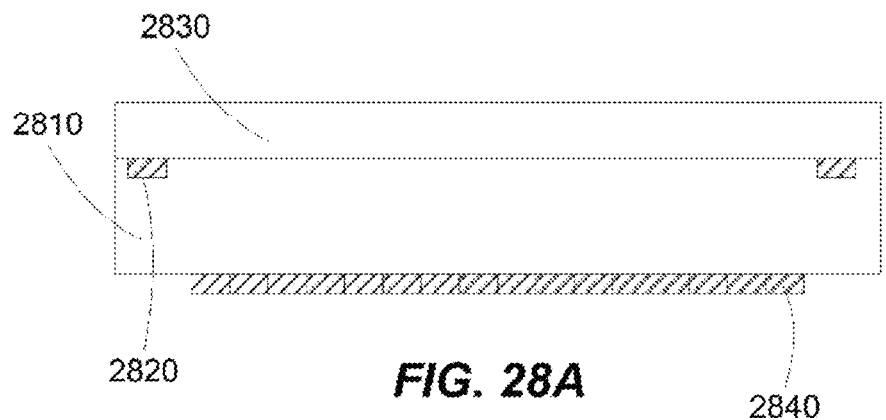
FIGS. 28A-28D illustrate mini donor plates with various means of attachments according to some embodiments.

FIGS. 28A-28D illustrate mini donor plates with various means of attachments according to some embodiments. In FIG. 28A, a mini donor plate 2810 is shown with the backing plate 2830, which is on top the mini donor plate 2810. The components 2840 are placed on the bottom of the mini donor plate 2810. The mini donor plate 2810 can be about 1 mm thick. The electrodes 2820 can be about 1 μm thick and about 1 mm wide, are covered by a dielectric layer with thickness between about 100 μm and less than 1 μm, whose surface is coplanar with the surface of the rest of the plate.

Figure 28B:
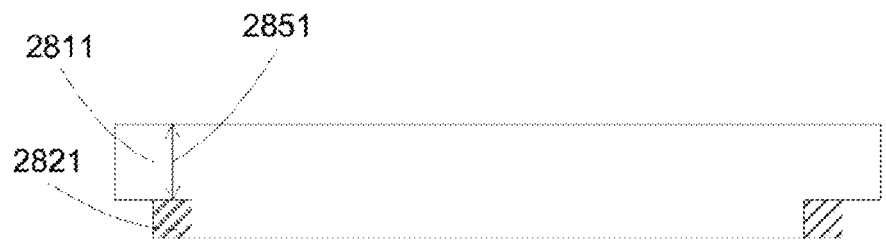

In FIG. 28B, a mechanical holding element 2821 can be used to hold the mini donor plate 2811. The height 2851 of the step is typically between about 0.25 and 0.75 mm, preferably about 0.5 mm. The holding element must be thinner than the difference between the plate thickness and the step height, in order not to interfere with the approach of the components to the substrate.

Figure 28C:

In FIG. 28C, a clip element 2822 can be used to hold the mini donor plate 2812. An array of the clip elements 2822 can be placed along the edge of the mini donor plate 2812. The clips can be attached to the backing plate and hold the mini donor plate 2812 against it. The mini donor plates can have a step along the edges. The advantage can be that a more even force can be distributed along the edges of the mini-plate. The disadvantage is that the mini donor plates cannot be placed as close together.

Figure 28D:
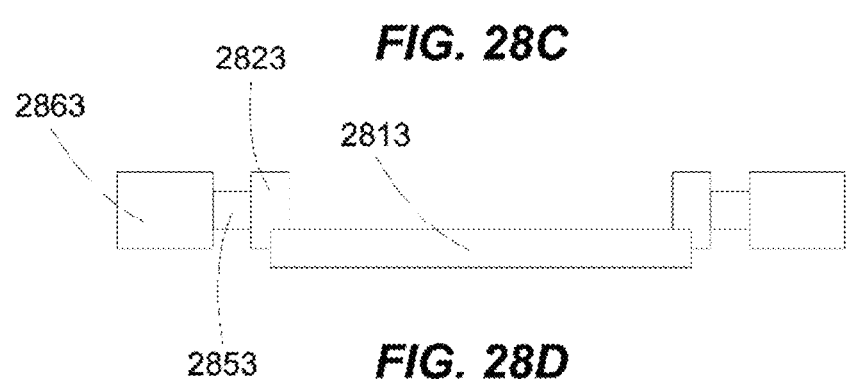

In FIG. 28D, side clips 2823 can be used to hold the mini donor plate 2813. Springs 2853 can push the side clips against plate holders or backing plate 2863.

Another method is the electrostatic chuck, which is commonly used in vacuum processing where a vacuum chuck cannot work. Some conductivity in the object to be held, or in an object which holds the object to be held, is required. Fused silica is not conducting, but narrow electrodes may be placed on the holder in between the locations of the mini-plates, and corresponding electrodes along the plate edges. For a simple unipolar Coulomb chuck, the force per unit area is $$F = \epsilon_0 \epsilon^2 A (U/d)^2$$

where U is the applied voltage, d is the distance between the electrodes (filled with dielectric of permittivity $\epsilon$), and $\epsilon_0$ is the permittivity of free space. A voltage of 1 kV (a value which is within the range commonly used with such devices) and a dielectric thickness of 100 μm gives a pressure of about 10 kPa.

If the plates have thin film electrodes 1 mm wide around the perimeter (as illustrated in FIG. 7), the area of electrode is approximately 0.8 cm², which gives a force of 0.8 N with the pressure calculated for the electrostatic holding mechanism (10 kPa). Comparing this value to the ~$10^{-2}$ N gravitational force experienced by the plate, this mechanism is demonstrated to be capable of satisfying the need for a technique to hold the mini-plates. The electrodes could be made even narrower, reducing the amount of area along the edges which cannot be used for chips. It is also possible to use the Johnsen-Rahbek electrostatic chuck design instead of the Coulomb design; it uses a slightly semiconducting dielectric instead of fully insulating, and results in a substantially larger holding force, up to 5-10 times larger depending on the material details. The vacuum and electrostatic attachment methods are particularly advantageous to allow minimum transfer distance between the components on the mini-plates and the target, since the mini-plates are attached to the bottom side of the plate holder and can be in direct contact with the target without any other feature in the way.

Yet another method to hold the mini-plates in position on a backing plate is with a mechanical fixture. A mesh or lattice of narrow (e.g. about 1 mm or 0.5 mm wide) rigid beams which align with the edges of the donor plates can be overlaid on the plates. The edges of the mini-plates should have a step, as illustrated in FIG. 7, so that the metal beams will not extend above the plane where the components are located. The thickness of the mini-plates is preferably not more than about 1 mm to allow a high degree of transparency to irradiation. The combination of the thickness of the beam and the plate material should be equal or less than the height of the step on the mini-plates, which is less than 1 mm. The mesh should be made of a rigid material which has a small degree of deflection under load, in order to keep the plates in the same plane. Suitable materials would be ceramics such as aluminum oxide or other oxides, or metals which have been stiffened by thermal or mechanical processing. In some embodiments, the mesh will include threaded rods which protrude through holes in the backing plate at the corners of each donor plate, thereby facilitating the minimization of deflection.

Instead of a continuous mesh, discrete clips may be used. The force can be distributed evenly along the perimeter of the mini-plate, ensuring complete parallelism to the backing plate. However, the clips will occupy some area which is not required using the mesh.

A mechanical mounting system using clips along the edges of the mini plates. The mini-plate is mainly supported by the plate holder on the edge; the components are on the underside facing down. The clips provide alignment guidelines and prevent mini-plate movement during operation. The clips can be all fixed with mini-plate size variation tolerance designed in. Or, some of the clips can be spring loaded and moveable to allow easy mounting of the mini-plate.

Figure 29A:
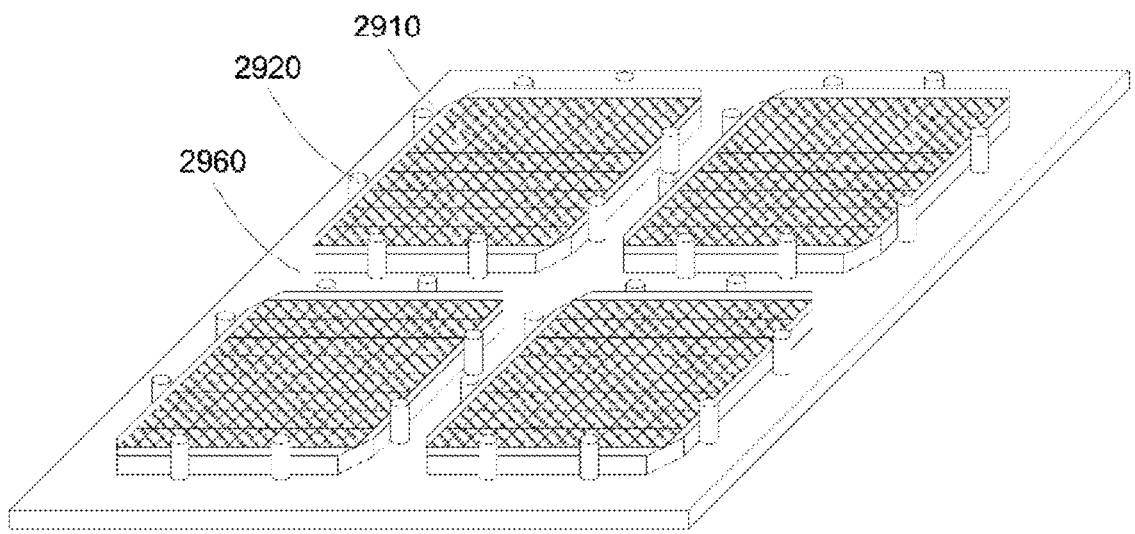
FIG. 29A illustrates discrete clips disposed along the edges of the mini donor plate according to some embodiments.

FIG. 29A illustrates discrete clips disposed along the edges of the mini donor plate according to some embodiments. Mini donor plates 2910 can be held against a backing plate 2960 by clips 2920. The opening on the donor plate holder is slightly narrower than the size of the mini-plate in both X and Y axis, so that the mini-plate is resting on the plate holder with support around the perimeter of the mini-plate. The discrete clips along the perimeter provide an alignment guide and prevent the movement of the mini-plate during operation. The clips can be any shape or any size. There can be multiple clips on each edge. In some embodiments, the discrete clips can be all fixed on the plate holder with suitable tolerance to the mini-plate size variation. In another embodiment, some of the clips can be fixed while the others are spring loaded with small range movement capability. In this configuration, the tolerance of mini-plate size variation increase. All mini-plates can be tightly held despite even slight size differences from the manufacturing process. The system allows easy loading and unloading of the mini-plate. One disadvantage of this configuration is that the distance between the components on the mini-plate and the substrate is limited by the thickness of the plate holder. In a preferred embodiment, this distance should be as small as possible, less than 1 mm and preferably less than 200 microns.

In some embodiments, the clips can be on the side wall of the opening on the plate holder. The clips can be a stripe of any shape that is connected to the sidewall of the opening by a spring. The components are on the bottom side of the mini-plate in this illustration. A corner of the clip is machined to have a step into which the mini-plate slides. The height of this step should be equal or less to the thickness of the mini-plate. The clips can be a stripe of any shape that is connected to the sidewall of the opening by springs. The mini-plate is mounted with the components facing away from the plate holder, so there is no restriction on the approach of the components to the substrate. A corner of the clip is machined to have a step for the mini-plate to sit in. The height of this step should be equal or less to the thickness of the mini-plate, so that the components on the mini-plate can approach as close as desired to the target. There can be one clip on each edge or only on one pair of the opposite edges. Given the small force requirement to hold the mini-plate against gravity, the spring constant requirement of the spring should be in a reasonable range.

In several of these embodiments (whether using vacuum, electrostatic, or mechanical holding mechanisms), the mini-plates may be placed on a flat surface in a close-packed array on the holding plate, and no other aligning structure is needed. For the electrostatic mechanism, the holding force may be switched on as each plate is put in its place, or if a vacuum holder with independent sections for each mini-plate is provided, the vacuum may be similarly switched on. The backing plate for the donor plates may have raised features along two sides against which the first plates are set. Optionally, the backing plate may have inset regions corresponding to the area of the donor plates to facilitate alignment. The plates may be constructed with dimensions which are accurately implemented to within about 1 micrometer, by use of precision machining techniques or microlithographic techniques which are well known in the art.

The mini-plates are preferably placed onto holders by an automated placement system in order to maximize throughput and alignment accuracy, and to minimize defects. The thickness of the plates should preferably be about 1 mm to about 3 mm, allowing for a vacuum gripping tool to conveniently grip the side of the plate and move it with precision.

Figure 29B:
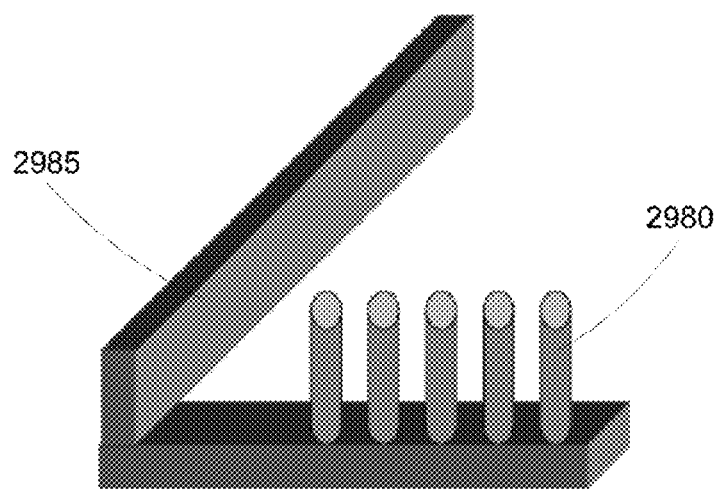
FIG. 29B illustrates a schematic illustration of a tool for manipulating the mini donor plates according to some embodiments.

FIG. 29B illustrates a schematic illustration of a tool for manipulating the mini donor plates according to some embodiments. The cylinders 2980 represent vacuum nozzles, which are fixed in a plane defined by the lower edge of the plate to which they are attached. The cylinders are preferably about 0.5 mm diameter, so that they can be placed in the middle of the edge of a mini-plate which is 1 mm thick and place it on a surface without themselves touching that surface. This tool will be held by structural members 2985 onto a positioning unit which can be moved in all directions.

In some embodiments, a single pattern of illumination is incident on the donor plates to cause the component transfers. For example, the mask which determines the pattern is an array of square apertures whose spacing corresponds to the spacing of the chips (3.40 units) and whose size corresponds to the size of the chips. For different chips, a different aperture size can be required but the spacing remains the same. In the operation of the process, the mask remains in place as long as the corresponding chip type is being placed; typically this would remain the same for long periods of time (hours or days) while the product run in question is being completed. Normally, a large number of substrates would be populated with the first type of component, and then they would be run through again and the second component added, and so on until all components are in place. The substrate is replaced on the stage as soon as all positions receive one component; the donor plate holder is replaced when it runs out of chips. The mask remains in place for the whole product run.

In some operations, where there are more mini-plates than targets, only a subset of the components aligned with each target may be illuminated in one exposure. For example, the blue components would be transferred, and then the miniplate holder realigned so as to align the green components with the desired positions on the target, and they would be illuminated. In this process, the mask pattern has to change. For this purpose, it is convenient to have a mask holder which can hold two or more overlays over the mask. The mask will have all of the desired patterns, and these will be precisely aligned to the target locations. An overlay mask will then block the light from going through the second pattern, while passing the first; the apertures will be larger than the main mask apertures and need not be precisely positioned. When the system is ready for the second exposure, this overlay is pulled out and a second one introduced, which blocks the light from going through the first pattern but passes the second. The advantage is that the overlays can be moved quickly without careful alignment, and so the exchange can keep pace with the process of aligning the donor plate holder and substrate, and does not slow the throughput appreciably.

What is claimed is:

1. A method comprising
providing a first donor plate, wherein the first donor plate comprises multiple chips arranged in a first array on a surface of the first donor plate, wherein the first array comprises a first period;
providing a second donor plate, wherein the second donor plate comprises a first layer of a photoactivated thermal transfer material;
simultaneously transferring the multiple chips from the first donor plate to the second donor plate, wherein the multiple chips are transferred to a second array on a second layer, wherein the second array comprises a second period, wherein the second period is different from the first period.

2. A method as in claim 1
wherein the first donor plate comprises a second layer of a photoactivated thermal transfer material, wherein the multiple chips are disposed on the second layer.

3. A method as in claim 1
wherein the second array comprises a two-dimensional periodicity,
wherein the second period of the second array comprises a first periodicity in an x direction and a second periodicity in a y direction,
wherein the first periodicity comprises a length of one or more chips of the multiple chips plus an additional x distance, wherein the additional x distance is such that a length of a module of a substrate is an integer multiple of the second period,
wherein the second periodicity comprises a width of one or more chips of the multiple chips plus an additional y distance, wherein the additional y distance is such that a width of a module of a substrate is an integer multiple of the second period.

4. A method as in claim 1 further comprising
providing a substrate, wherein the substrate comprises a module array wherein the module array comprises a module period;
simultaneously transferring multiple chips of the second array from the second donor plate to the substrate, wherein one chip of the second array is transferred to one cell of the module array.

5. A method as in claim 4 further comprising
moving the substrate to a second location;
simultaneously transferring multiple chips of the second array from the second donor plate to the substrate, wherein one chip of the second array is transferred to one cell of the module array.

6. A method as in claim 4 further comprising
providing a third donor plate, wherein the third donor plate comprises a third layer of a photoactivated thermal transfer material, wherein the third donor plate comprises a third array of chips on the third layer, wherein the third array comprises a third period, wherein the module period is an integer multiple of the third period;
simultaneously transferring multiple chips of the third array from the third donor plate to the substrate, wherein one chip of the third array is transferred to one cell of the module array.

7. A method comprising
providing a first donor plate, wherein the first donor plate comprises multiple chips arranged in a first array on a surface of the first donor plate, wherein the first array comprises a first periodicity;
providing a second donor plate, wherein the second donor plate comprises a first layer of a photoactivated thermal transfer material;
simultaneously transferring one or more first rows of chips in the first array from the first donor plate to the second donor plate, wherein the one or more first rows of chips are transferred on the first layer;
simultaneously transferring one or more second rows of chips in the first array from the first donor plate to the second donor plate, wherein the one or more second rows of chips are transferred on the first layer, wherein a separation distance between the one or more first rows of chips and the one or more second rows of chips on the second donor plate is different than a separation distance between the one or more first rows of chips and the one or more second rows of chips on the first donor plate;
simultaneously transferring one or more first columns of chips in the first array from the first donor plate to the second donor plate, wherein the one or more first columns of chips are transferred on the first layer;
simultaneously transferring one or more second columns of chips in the first array from the first donor plate to the second donor plate, wherein the one or more second columns of chips are transferred on the first layer, wherein a separation distance between the one or more first columns of chips and the one or more second columns of chips on the second donor plate is different than a separation distance between the one or more first columns of chips and the one or more second columns of chips on the first donor plate.

8. A method as in claim 7
wherein the one or more first rows and the one or more second rows on the first donor plate are adjacent to each other,
wherein the one or more first rows and the one or more second rows on the second donor plate are separated by an additional distance,
wherein the additional distance is such that a length of a module of a substrate is an integer multiple of a combination length of a width of the one or more first rows and the additional distance.

9. A method as in claim 7
wherein the one or more first columns and the one or more second columns on the first donor plate are adjacent to each other, wherein the one or more first columns and the one or more second columns on the second donor plate are separated by an additional distance,
wherein the additional distance is such that a width of a module of a substrate is an integer multiple of a combination length of a length of a chip of the one or more first columns and the additional distance.

10. A method as in claim 7 further comprising
providing a substrate, wherein the substrate comprises a module array wherein the module array comprises a module period;
simultaneously transferring multiple chips of a second array from the second donor plate to the substrate, wherein one chip of the second array is transferred to one cell of the module array.

11. A method as in claim 10 further comprising
moving the substrate to a second location;
simultaneously transferring multiple chips of a second array from the second donor plate to the substrate, wherein one chip of the second array is transferred to one cell of the module array.

12. A method as in claim 10 further comprising
providing a third donor plate, wherein the third donor plate comprises a third layer of a photoactivated thermal transfer material, wherein the third donor plate comprises a third array of chips on the third layer, wherein the third array comprises a third period, wherein the module period is an integer multiple of the third period;
simultaneously transferring multiple chips of the third array from the third donor plate to the substrate, wherein one chip of the third array is transferred to one cell of the module array.

13. A method comprising
providing a first donor plate, wherein the first donor plate comprises multiple chips arranged in a first array on a surface of the first donor plate, wherein the first array comprises a first period;
providing multiple second donor plates, wherein the multiple second donor plates comprises a first layer of a photoactivated thermal transfer material;
simultaneously transferring multiple second arrays of chips in the first array from the first donor plate to the multiple second donor plates, wherein each of the multiple second arrays is a subset of the first array, wherein the multiple second arrays of chips are transferred on the first layer.

14. A method as in claim 13 further comprising
assembling more than one second donor plates of the multiple second donor plates, wherein there is an additional distance between the more than one second donor plates,
wherein the additional distance is such that a length of a module of a substrate is an integer multiple of a combination length of a length of the more than one second donor plates and the additional distance.

15. A method as in claim 13 further comprising
assembling more than one second donor plates of the multiple second donor plates, wherein there is an additional distance between the more than one second donor plates,
wherein the additional distance is such that a width of a module of a substrate is an integer multiple of a combination length of a width of the more than one second donor plates and the additional distance.

16. A method as in claim 13 further comprising
assembling two second donor plates of the multiple second donor plates, wherein there is an additional distance between the two second donor plates,
wherein the additional distance is such that a length of a module of a substrate is an integer multiple of a combination length of a length of a second donor plate and the additional distance.

17. A method as in claim 13 further comprising
assembling two second donor plates of the multiple second donor plates, wherein there is an additional distance between the two second donor plates,
wherein the additional distance is such that a width of a module of a substrate is an integer multiple of a combination length of a width of a second donor plate and the additional distance.

18. A method as in claim 13 further comprising
providing a substrate, wherein the substrate comprises a module array wherein the module array comprises a module period;
simultaneously transferring multiple chips from the multiple second donor plates to the substrate, wherein one chip from each second donor plate of the multiple second donor plates is transferred to each cell of the module array.

19. A method as in claim 18 further comprising
moving the substrate to a second location;
simultaneously transferring multiple chips from the multiple second donor plates to the substrate, wherein one chip from each second donor plate of the multiple second donor plates is transferred to each cell of the module array.

20. A method as in claim 18 further comprising
providing multiple third donor plates, wherein multiple third donor plates comprise a third layer of a photoactivated thermal transfer material, wherein the multiple third donor plates comprise an array of chips on the third layer, wherein the multiple third donor plates comprise a third period, wherein the module period is an integer multiple of the third period;
simultaneously transferring multiple chips from the multiple third donor plates to the substrate, wherein one chip from each third donor plate of the multiple third donor plates is transferred to each cell of the module array.

* * * * *